(12) United States Patent
Ashihara et al.

(10) Patent No.: US 6,764,945 B2
(45) Date of Patent: Jul. 20, 2004

(54) METHOD OF MANUFACTURING A MULTILAYER METALLIZATION STRUCTURE WITH NON-DIRECTIONAL SPUTTERING METHOD

(75) Inventors: Hiroshi Ashihara, Ome (JP); Tatsuyuki Saito, Ome (JP); Uitsu Tanaka, Hamura (JP); Hidenori Suzuki, Tachikawa (JP); Hideaki Tsugane, Fussa (JP); Yasuko Yoshida, Sayama (JP); Ken Okutani, Tachikawa (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 09/822,318

(22) Filed: Apr. 2, 2001

(65) Prior Publication Data

US 2002/0098670 A1 Jul. 25, 2002

(30) Foreign Application Priority Data

Jan. 23, 2001  (JP) ........................................ 2001-014068

(51) Int. Cl.⁷ ......................................... H01L 21/4763
(52) U.S. Cl. ..................... 438/637; 438/643; 438/648
(58) Field of Search ................................ 438/637, 643, 438/648

(56) References Cited

U.S. PATENT DOCUMENTS

| 5,403,779 | A | * | 4/1995 | Joshi et al. ................. 438/634 |
| 5,918,149 | A | * | 6/1999 | Besser et al. ............... 438/680 |
| 6,189,209 | B1 | * | 2/2001 | Saran ........................... 29/852 |
| 6,287,954 | B1 | * | 9/2001 | Ashley et al. .............. 438/622 |
| 6,334,249 | B2 | * | 1/2002 | Hsu ............................. 29/852 |
| 6,337,515 | B1 | * | 1/2002 | Miyamoto ................... 257/751 |
| 6,432,819 | B1 | * | 8/2002 | Pavate et al. ............... 438/676 |
| 6,436,819 | B1 | * | 8/2002 | Zhang et al. ............... 438/656 |
| 6,448,173 | B1 | * | 9/2002 | Clevenger et al. .......... 438/627 |
| 6,627,996 | B1 | * | 9/2003 | Yokoyama et al. ......... 257/758 |

FOREIGN PATENT DOCUMENTS

EP          1 094 504 A2  *  4/2001

OTHER PUBLICATIONS

Dixit et al., Ion metal plasma (IMP) depositing titanium liners for 0.25/0.18 μm multilevel interconnections, *IEDM*, (Dec. 1996) 357.*
Tokei et al., Step coverage and continuity of an I–PVD Ta(N) barrier layer : limitations, *Proc. IEEE Int. Interconnect Tech. Conf.* (Jun. 2001)213.*

* cited by examiner

*Primary Examiner*—Vu A. Le
*Assistant Examiner*—Christian D. Wilson
(74) *Attorney, Agent, or Firm*—Antonelli, Terry, Stout & Kraus, LLP

(57) ABSTRACT

In order to form a good contact between metallizations and improve the reliability and product yield of a semiconductor integrated circuit device, a plug is formed in a contact hole by depositing a first sputter film inside of the contact hole by traditional sputtering, depositing a second sputter film over the first sputter film by long throw sputtering, depositing a W film over the second sputtering film by CVD and removing the first and second sputter films and the W film from the outside of the contact hole. The barrier properties can be improved by constituting a barrier film from the first sputter film and second sputter film which are different in directivity.

21 Claims, 35 Drawing Sheets

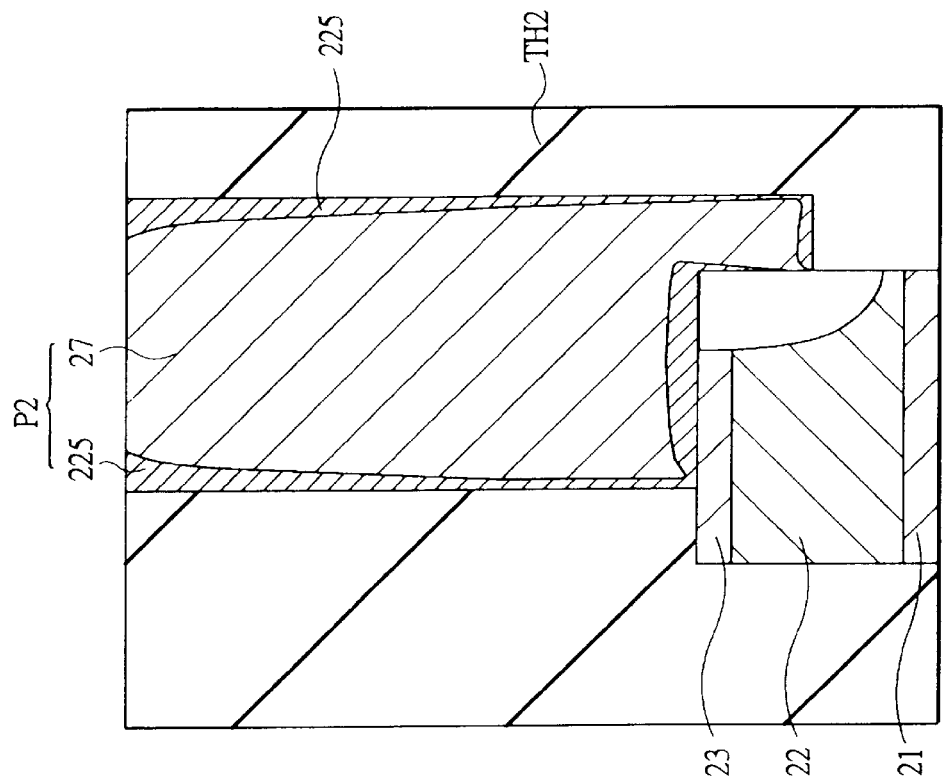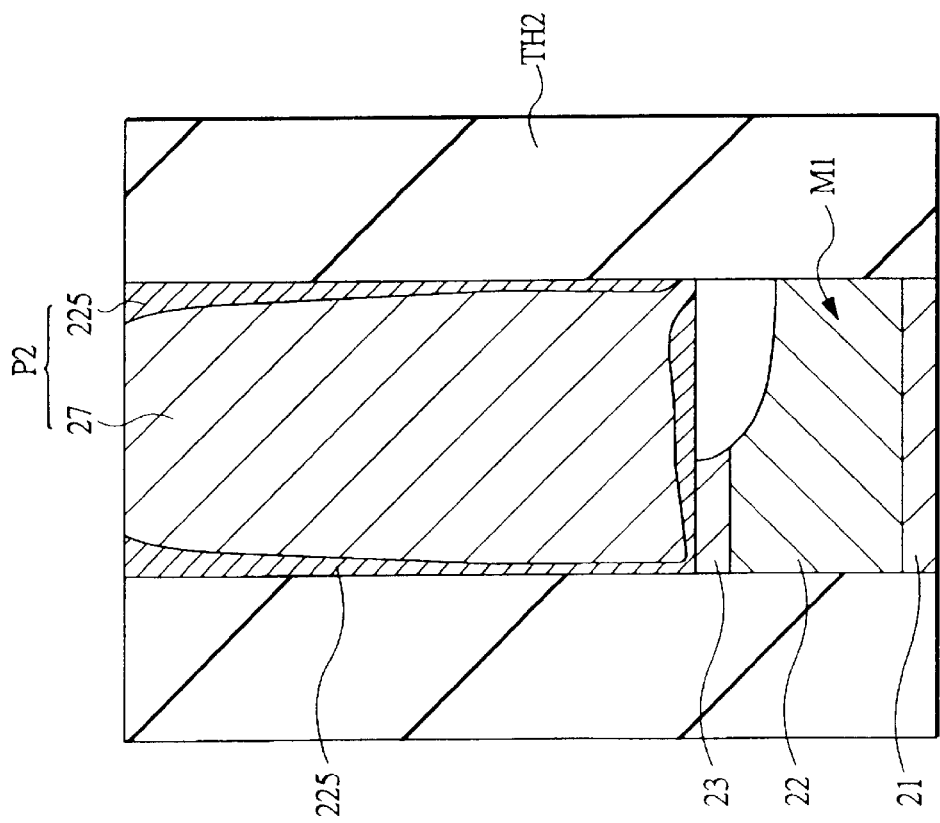

METHOD OF MANUFACTURING A MULTILAYER METALLIZATION STRUCTURE WITH NON-DIRECTIONAL SPUTTERING METHOD

BACKGROUND OF THE INVENTION

The present invention relates to a semiconductor integrated circuit device and a fabrication technique of a semiconductor integrated circuit device, particularly to a technique effective when adapted to the connection between metallizations of a semiconductor integrated circuit device or connection between a semiconductor substrate and a metallization.

With a recent tendency to high integration of LSI, a multilayer metallization structure having metallizations and insulating films formed alternately in repetition has been adopted. Such plural metallizations or a semiconductor substrate and a metallization are connected through an electroconductive portion (plug or the like) formed in the contact hole in an interlayer insulating film.

In Japanese Patent Application Laid-Open No. Hei 11(1999)-87353, disclosed is a technique for forming an electroconductive plug by forming, in a connecting hole CH and over a copper metallization 11, a TiN film 12 serving effectively as a barrier layer by long throw sputtering, depositing thereover a W layer, and polishing a tungsten layer 13 and the TiN layer by CMP.

In Japanese Patent Application Laid-Open No. Hei 8(1996)-181212, disclosed is a technique for forming a second metallization film in order to prevent peeling of a TiN film and improve barrier properties, which is attained by annealing a Ti film, which has been formed in a contact hole, by collimation sputtering, forming a TiN film 23, forming thereover a reactive sputter TiN film 24 and then depositing a W film 12 by CVD.

In Japanese Patent Application Laid-Open No. Hei 10(1998)-242271, disclosed is a technique (FIG. 4) for securing the contact between a connecting plug and groove metallization by forming a connecting plug 45, making a metallization groove 46 in such a way that the connecting plug 45 invades the metallization groove 46, forming a TiN/Ti film as an underlying film 47 by LD sputtering, and forming a Cu layer 48a, thereby forming a groove metallization 48.

In Japanese Patent Application Laid-Open No. Hei 6(1994)-140359, disclosed is a technique for forming, in a contact hole 50 and over a BPSG film 30, a layer 40 from a sputter target 70 through a collimator 60 by chemical reactive sputtering.

In Japanese Patent Application Laid-Open No. Hei 4(1992)-207033, disclosed is a technique for attaining good filling of a via hole and planarization of a metallization layer, which comprises depositing a first electroconductive film on the bottom of the via hole by high-temperature/high-bias or high-temperature sputtering, or selective metal CVD and then depositing thereover a second electroconductive film by traditional sputtering and vapor deposition.

In Japanese Patent Application Laid-Open No. Hei 4(1992)-207033, disclosed is a technique for constituting a plug 5 from a barrier film 5a obtained by depositing titanium or titanium nitride by sputtering, an underlying film Sb obtained by depositing tungsten over the barrier film 5a by sputtering and a filling film 5c obtained by depositing a tungsten film by CVD for filling therewith an opening.

SUMMARY OF THE INVENTION

With a view to overcoming connection failure between metallizations or between a semiconductor substrate and a metallization, the present inventors have carried out an investigation on a technique for filling a contact hole (via hole) with an electroconductive film.

This contact hole is formed on a metallization or a semiconductor substrate and after formation of a barrier film inside of the contact hole, an electroconductive film such as tungsten (W) film is filled inside of the contact hole. This barrier film is formed to prevent the reaction between a raw material gas and metallization (such as aluminum) upon formation of the W film.

With a miniaturization tendency of a semiconductor integrated circuit device, however, a contact hole inevitably has a larger aspect ratio. Aspect ratios exceeding 3.0, for example, deteriorate the barrier properties of the barrier film on the bottom of the contact hole, thereby increasing the frequency of connection failure.

With a miniaturization of a metallization width or diameter of a contact hole, the margin between the metallization and the contact hole tends to become smaller, thereby tending to cause positional deviation (deviation of the contact hole relative to a metallization pattern). In such a case, a sub-trench (a concave of a small diameter) appears on the side walls of the metallization as will described later, causing a more difficulty in securing barrier properties.

An object of the present invention is therefore to attain a good contact between metallizations or between a substrate and a metallization.

Another object of the present invention is to heighten the reliability of a semiconductor integrated circuit device by forming a good contact between metallizations or between a substrate and a metallization and to improve the yield of the product.

The object and another object, and novel features of the present invention will be apparent from the description herein and accompanying drawings.

Among the present inventions disclosed by the present application, typical ones will next be described simply.

(1) A method for fabricating a semiconductor integrated circuit device according to the present invention comprises depositing a first electroconductive film in a contact hole by first sputtering, depositing a second electroconductive film over the first electroconductive film by second sputtering having higher directivity than first sputtering, and depositing a third electroconductive film over the second electroconductive film.

(2) A method for fabricating a semiconductor integrated circuit device according to the present invention comprises depositing a first electroconductive film in a contact hole by long throw sputtering or ionized sputtering, depositing a second electroconductive film over the first electroconductive film by traditional sputtering, and depositing a third electroconductive film over the second electroconductive film.

(3) A semiconductor integrated circuit device according to the present invention comprises a contact hole formed in an insulating film, a first sputter film formed on the bottom and side walls of the contact hole, a second sputter film which is formed over the first sputter film on the bottom and side walls of the contact hole and has higher directivity than the first sputter film, and an electroconductive film filled inside of the contact hole.

(4) A semiconductor integrated circuit device according to the present invention comprises a contact hole formed in an insulating film, a first sputter film which is formed on the bottom and side walls of the contact hole by long throw sputtering or ionized sputtering, a second sputter film which is formed over the first sputter film on the bottom and side walls of the contact hole and has higher directivity than the first sputter film, and an electro-conductive film filled inside of the contact hole.

BRIEF DESCRIPTION OF THE DRAWINGS

FIGS. 27($a$) and ($b$) each illustrates the effects of this embodiment;

DETAILED DESCRIPTION OF THE PREFERRED EMBODIMENTS

Figure 1:
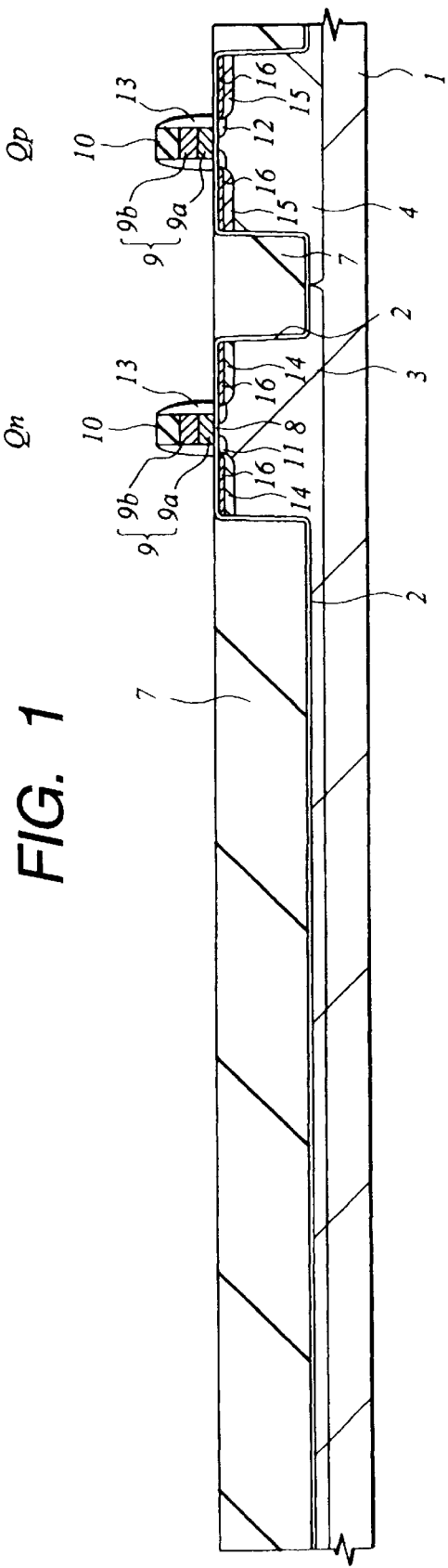
FIG. 1 is a fragmentary cross-sectional view of a substrate, which view illustrates the fabrication method of a semiconductor integrated circuit device according to Embodiment 1 of the present invention.

Prior to description of the embodiments of present inventions according to the present application, the essential meaning of the terms used herein will next be described.

The term "semiconductor device" as used herein means not only that fabricated over a single crystal silicon substrate but also that fabricated on another substrate such as an SOI (Silicon On Insulator) substrate or a substrate for the production of TFT (Thin Film Transistor) liquid crystal unless otherwise specifically described.

The term "semiconductor wafer (semiconductor substrate)" as used herein means a silicon or another semiconductor single crystal substrate (generally, having a substantially flat disc shape), a sapphire substrate, glass substrate or another insulating, semi-insulating or semiconductor substrate, or a composite substrate thereof.

If necessary for convenience in the below-described embodiments, they will be explained, divided into plural sections or plural embodiments. They however relate to each other and one section or embodiment is a modification example, details or a complementary description of one or whole portion of another section or example.

In the below-described embodiments, reference is made to the number of elements (including the number, numerical value, quantity and range). The number of the elements is however not limited to the specific one and elements may be used in the number less or greater than the specific number unless otherwise particularly indicated or apparently limited to a specific number in principle.

Furthermore in the below-described examples, it is obvious that constituting elements (including elemental steps or the like) are not always indispensable unless otherwise particularly specified or unless otherwise presumed to be apparently indispensable in principle.

Similarly, when reference is made to the shape, positional relationship or the like of constituting elements, those substantially close or similar to their shapes or the like are included unless otherwise specifically indicated or presumed to be apparently different in principle. This also applies to the above-described numerical value and range.

In all the drawings for describing the embodiments, like members of a function will be identified by like reference numerals and overlapping descriptions will be omitted.

In the embodiments of the present invention, MOS-FET (Metal Oxide Semiconductor Field Effect Transistor) meaning a field effect transistor will be abbreviated as MOS, a p channel type MOS-FET will be abbreviated as pMOS and an n channel type MOS•FET will be abbreviated as nMOS. The MOS•FET embraces MIS•FET (Metal Insulator Semiconductor Field Effect Transistor), but a description will hereinafter be made with MOS•FET as a typical example.

In this application, the term "long throw sputtering" as used herein means sputtering having the minimum distance (intrinsic distance) of 150 mm or greater from a target to the surface of a wafer to be treated. When a wafer to be treated has a diameter of 200 to 300 mm or greater, the minimum distance is preferably 165 mm or greater. Under severer conditions, the distance of 180 mm or greater is more preferred. In traditional non-directional sputtering, the distance (intrinsic distance) is usually around 50 mm, with about 100 mm as the maximum. Sputtering having an intrinsic distance less than 150 mm is called "not-long-throw sputtering" for conveniences sake.

Sputtering which can be applied to the present application can be classified as follows. Sputtering can be roughly classified into traditional sputtering and directional sputtering. This directional sputtering can be classified into collimator sputtering, ionized sputtering and long throw sputtering. Long throw sputtering can be classified further into bias long throw sputtering and normal long throw sputtering.

Among them, collimator sputtering involves a problem of foreign matters but has a merit that the apparatus can be made compact. Ionized sputtering makes it possible to secure high directivity even if the distance is relatively short. Bias long throw sputtering can actualize higher directivity than normal long throw sputtering, because a bias is applied in the former sputtering.

In the present application, when a description is made of a material, more specifically, there is a description such as "copper metallization" or "member made of copper", not only pure (containing impurities and additives in an amount less than 1%) copper but also a material having copper as one of its main components is included.

(Embodiment 1)

Next, the fabrication method of a semiconductor integrated circuit device according to Embodiment 1 of the present invention will be described. FIGS. 1 to 26 are fragmentary cross-sectional views of a substrate, which views each illustrates the fabrication method of a semiconductor integrated circuit device according to Embodiment 1 of the present invention.

As illustrated in FIG. 1, an n-channel type MISFETQn and a p-channel type MISFETQp are formed on the main surface of a semiconductor substrate 1 by the ordinarily employed MISFET formation method.

For example, MISFET is formed ordinarily by the following method.

An element isolation groove 2 is formed by etching the semiconductor substrate 1 made of p type single crystal silicon, followed by heat oxidation of the substrate 1 to form a thin silicon oxide film on the inside wall of the groove. A silicon oxide film 7 is deposited by CVD (Chemical Vapor Deposition) over the substrate 1 including the inside of the groove. By chemical mechanical polishing (CMP), the silicon oxide film 7 on the groove is polished to planarize the surface.

After ion implantation of p type impurities and n type impurities into the substrate 1, the impurities are diffused by heat treatment, whereby a p type well 3 and an n type well 4 are formed. By heat oxidation, a clean gate oxide film 8 of about 6 nm thick is formed on the surface of each of the p type well 3 and n type well 4.

Over the gate oxide film 8, phosphorous-doped low-resistance polycrystalline silicon film 9a is deposited by CVD, followed by deposition thereover of a thin WN film (not illustrated) and a W film 9b by sputtering. A silicon nitride film 10 is then deposited thereover by CVD.

The silicon nitride film 10 is then subjected to dry etching to leave a portion of it in a region wherein a gate electrode is to be formed. With the silicon nitride film 10 as a mask, the W film 9b, WN film (not illustrated) and polycrystalline silicon film 9a are dry etched to form a gate electrode 9 formed of the polycrystalline silicon film 9a, WN film and W film 9b.

Into the p type wells 3 on both sides of the gate electrode 9, n type impurities are ion-implanted to form an $n^-$ type semiconductor region 11, while $p^-$ type semiconductor region 12 is formed by ion-implantation of p type impurities into the n type well 4.

After deposition of a silicon nitride film over the substrate 1 by CVD, anisotropic etching is conducted to form a side wall spacer 13 on each of the side walls of the gate electrode 9.

Then, n type impurities are ion-implanted into the p type well 3 to form $n^+$ type semiconductor regions 14 (source, drain), while $p^+$ type semiconductor regions 15 (source, drain) are formed by ion-implantation of p type impurities into the n type well 4.

The surface of the semiconductor substrate 1 is washed with a hydrofluoric acid type washing liquid. This washing aims at removal of impurities or a natural oxide film from the surface of the semiconductor substrate 1. A Co film is then deposited by sputtering, followed by heat treatment at 500 to 540° C. for 1 minute, whereby a silicide-forming reaction is caused at the contact portion of the semiconductor substrate 1 ($n^+$ type semiconductor region 14, $p^+$ type semiconductor region 15) with the Co film.

The unreacted portion of the Co film is then removed by etching to leave a $CoSi_2$ layer 16 over the semiconductor substrate 1 ($n^+$ type semiconductor region 14, $p^+$ type semiconductor region 15). The resistance of this $CoSi_2$ layer 16 is made low by heat treatment at 700 to 800° C. for about 1 minute. Alternatively, a $TiSi_2$ film may be formed by deposition of a Ti film over the semiconductor substrate 1.

This $CoSi_2$ layer 16 is formed to decrease the resistance in the source and drain regions ($n^+$ type semiconductor region 14, $p^+$ type semiconductor region 15), and decrease the contact resistance with a plug formed over the source and drain regions. The $CoSi_2$ layer 16 may also be formed over the gate electrode 9 in order to reduce the resistance of the gate electrode 9 (metallization).

By the steps so far mentioned, an n-channel type MISFETQn and a p-channel type MISFETQP each equipped with source and drain having an LDD (Lightly Doped Drain) structure are formed.

A plurality of metallizations will thereafter be formed by alternately depositing, over this MISFETQn and Qp, interlayer insulating films such as silicon oxide film and electroconductive films such as Al film. Formation of the interlayer insulating films and metallizations will next be described specifically with reference to FIGS. 2 to 26.

Figure 2:
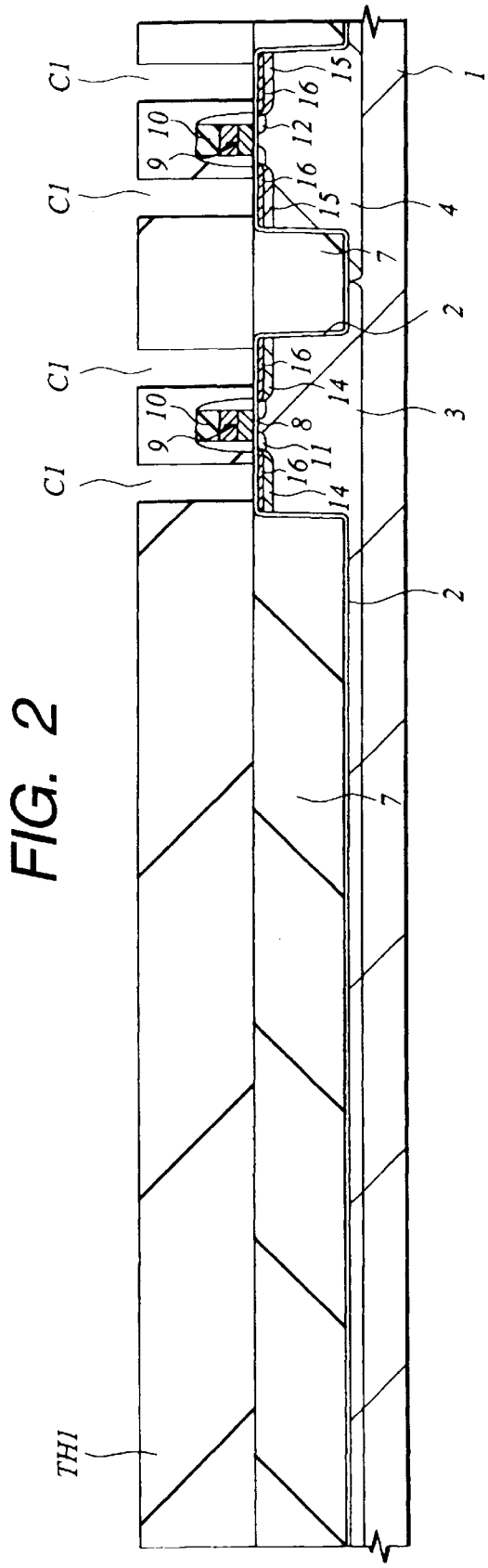
FIG. 2 is a fragmentary cross-sectional view of a substrate, which view illustrates the fabrication method of a semiconductor integrated circuit device according to Embodiment 1 of the present invention.

As illustrated in FIG. 2, after formation of a silicon oxide film of about 700 to 800 nm thick over MISFETQn and Qp by CVD, the silicon oxide film is polished by CMP to have a planarized surface, whereby an interlayer insulating film TH1 is formed.

A photoresist film (not illustrated) is laid over the interlayer insulating film TH1. With this photoresist film as a mask, the interlayer insulating film TH1 is etched to form a contact hole C1 above the $n^+$ type semiconductor region 14 and $p^+$ type semiconductor region 15 on the main surface of the semiconductor substrate 1. Pre-cleaning treatment is conducted in an argon (Ar) atmosphere to remove a natural oxide film or the like formed on the bottom of the contact hole C1.

Figure 3:
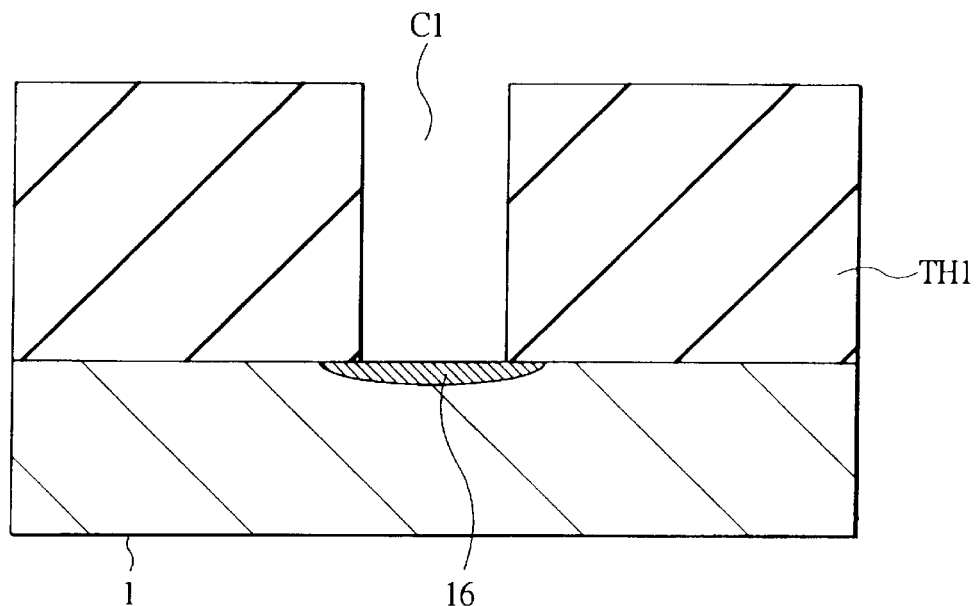
FIG. 3 is a fragmentary cross-sectional view of a substrate, which view illustrates the fabrication method of a semiconductor integrated circuit device according to Embodiment 1 of the present invention.

FIG. 3 is an enlarged view of the contact hole C1 of FIG. 2. From this diagram, source and drain regions ($n^+$ type semiconductor region 14, $p^+$ type semiconductor region 15) are omitted. Subsequent steps will be described using the enlarged view of this contact hole C1.

Figure 4:
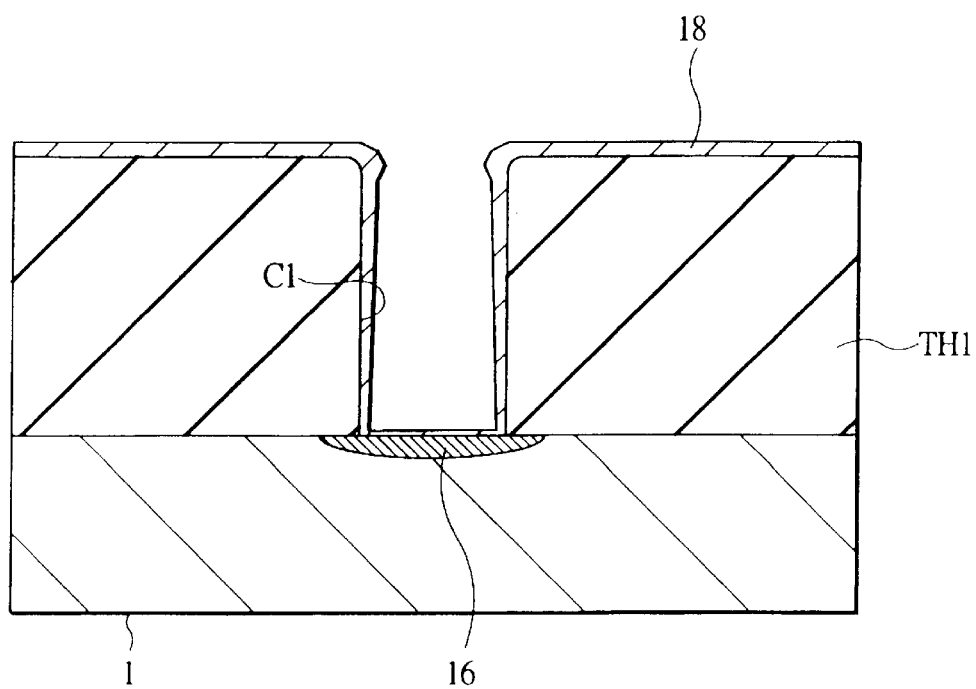
FIG. 4 is a fragmentary cross-sectional view of a substrate, which view illustrates the fabrication method of a semiconductor integrated circuit device according to Embodiment 1 of the present invention.

As illustrated in FIG. 4, a barrier high-melting point metal film 18, which is a laminate of a Ti film and a TiN film, is deposited over the interlayer insulating film TH1 including the inside of the contact hole C1 by sputtering or CVD. The above-described pre-cleaning treatment and formation step of the barrier high-melting-point metal film 18 are conducted continuously in a high vacuum.

Figure 5:
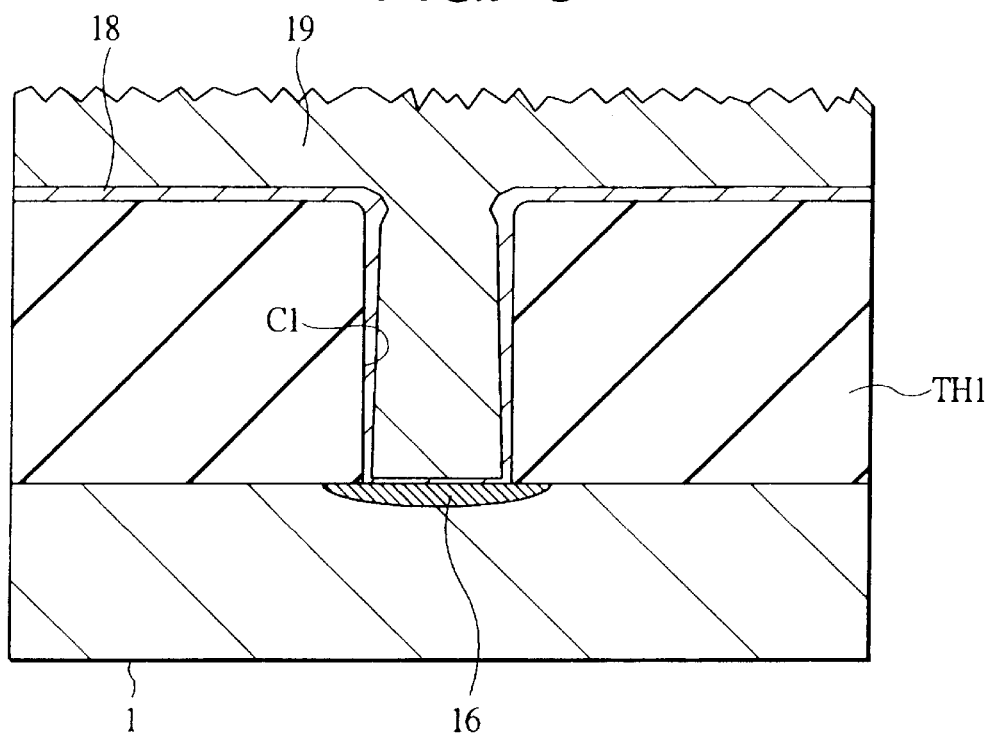
FIG. 5 is a fragmentary cross-sectional view of a substrate, which view illustrates the fabrication method of a semiconductor integrated circuit device according to Embodiment 1 of the present invention.

As illustrated in FIG. 5, a W film 19 is deposited over the barrier high-melting-point metal film 18 by CVD. This W film 19 is deposited to give a thickness enough to fill therewith the contact hole C1.

Figure 6:
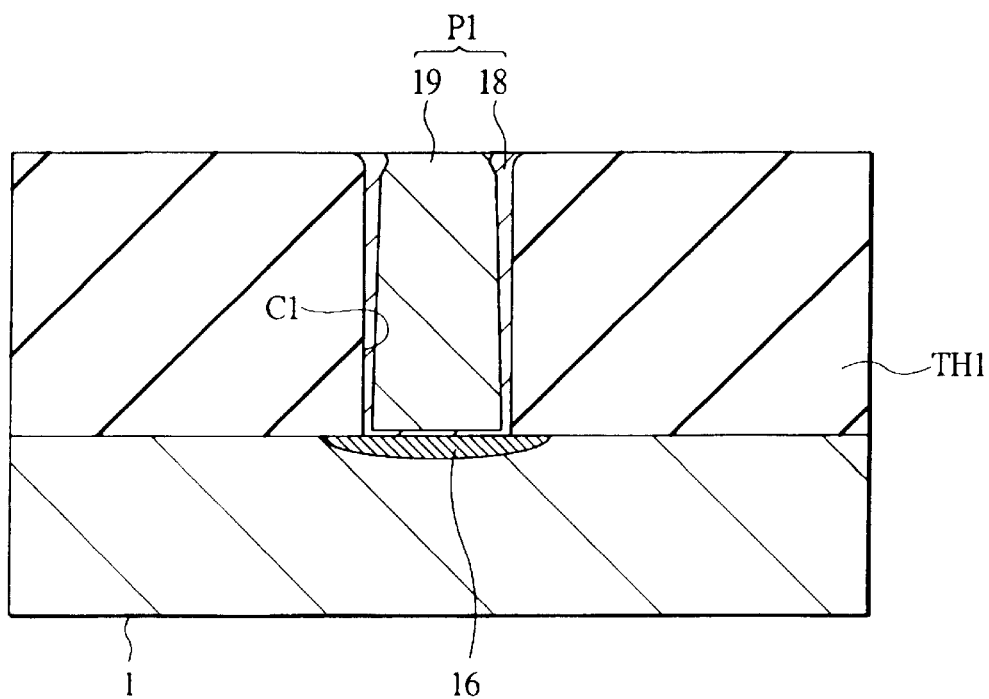
FIG. 6 is a fragmentary cross-sectional view of a substrate, which view illustrates the fabrication method of a semiconductor integrated circuit device according to Embodiment 1 of the present invention.

As illustrated in FIG. 6, the W film 19 and barrier high-melting-point metal film 18 are polished by CMP until the exposure of the interlayer insulating film TH1, whereby a plug P1 is formed inside of the contact hole C1.

Figure 7:
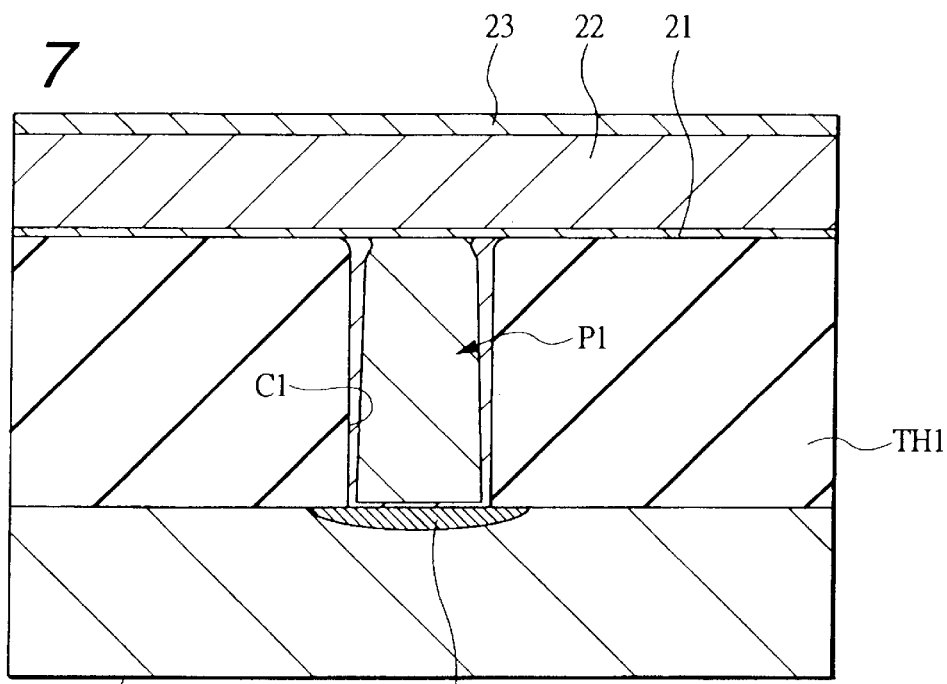
FIG. 7 is a fragmentary cross-sectional view of a substrate, which view illustrates the fabrication method of a semiconductor integrated circuit device according to Embodiment 1 of the present invention.

As illustrated in FIG. 7, after deposition, over the interlayer insulating film TH1 and plug P1, a barrier high-melting-point metal film 21 which is a laminate of a Ti film, a TiN film and a Ti film (Ti/TiN/Ti=5/50/10 nm) by sputtering, an aluminum (Al) alloy film 22 (350 nm) is deposited. Over this Al alloy film 22, a cap metal film 23, which is a laminate of a TiN film and a Ti film (TiN/Ti=40/5 nm) is deposited. The cap metal film 23 serves as a protecting film of the Al alloy film 22 and also an antireflection film upon patterning of the first-level metallization M1 which will be described later.

Figure 8:
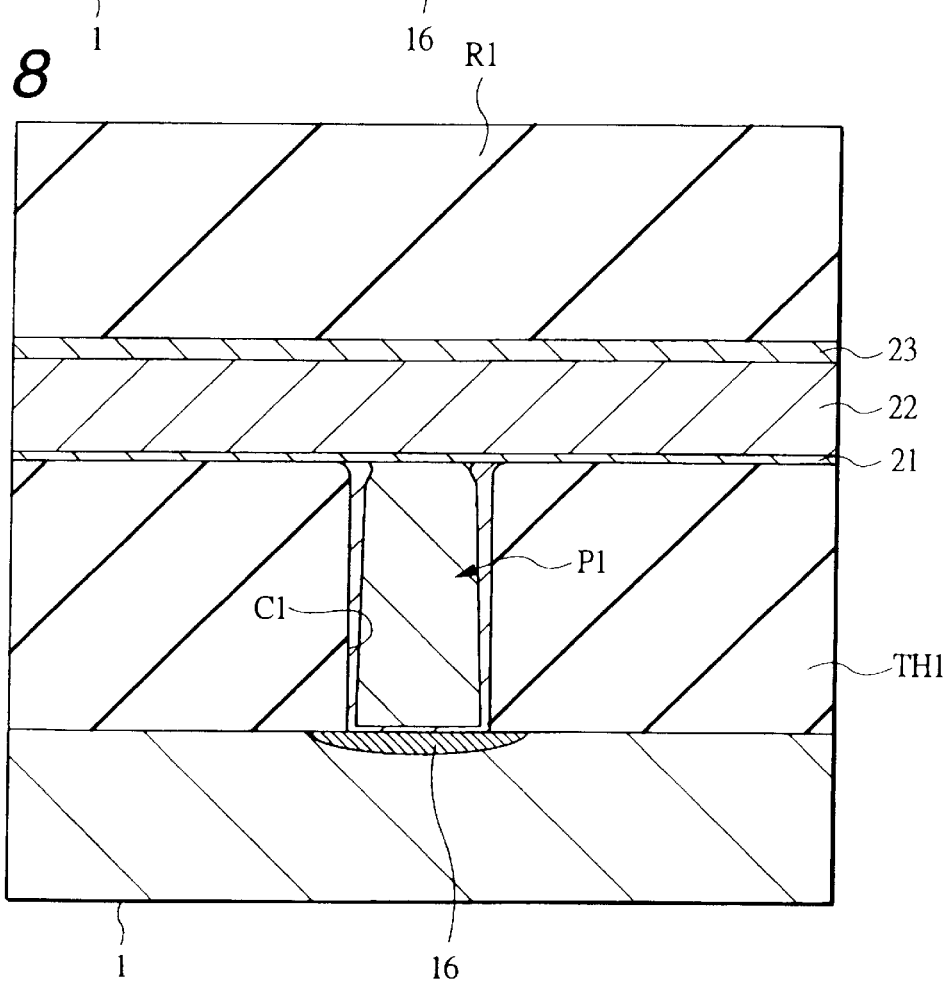
FIG. 8 is a fragmentary cross-sectional view of a substrate, which view illustrates the fabrication method of a semiconductor integrated circuit device according to Embodiment 1 of the present invention.
Figure 9:
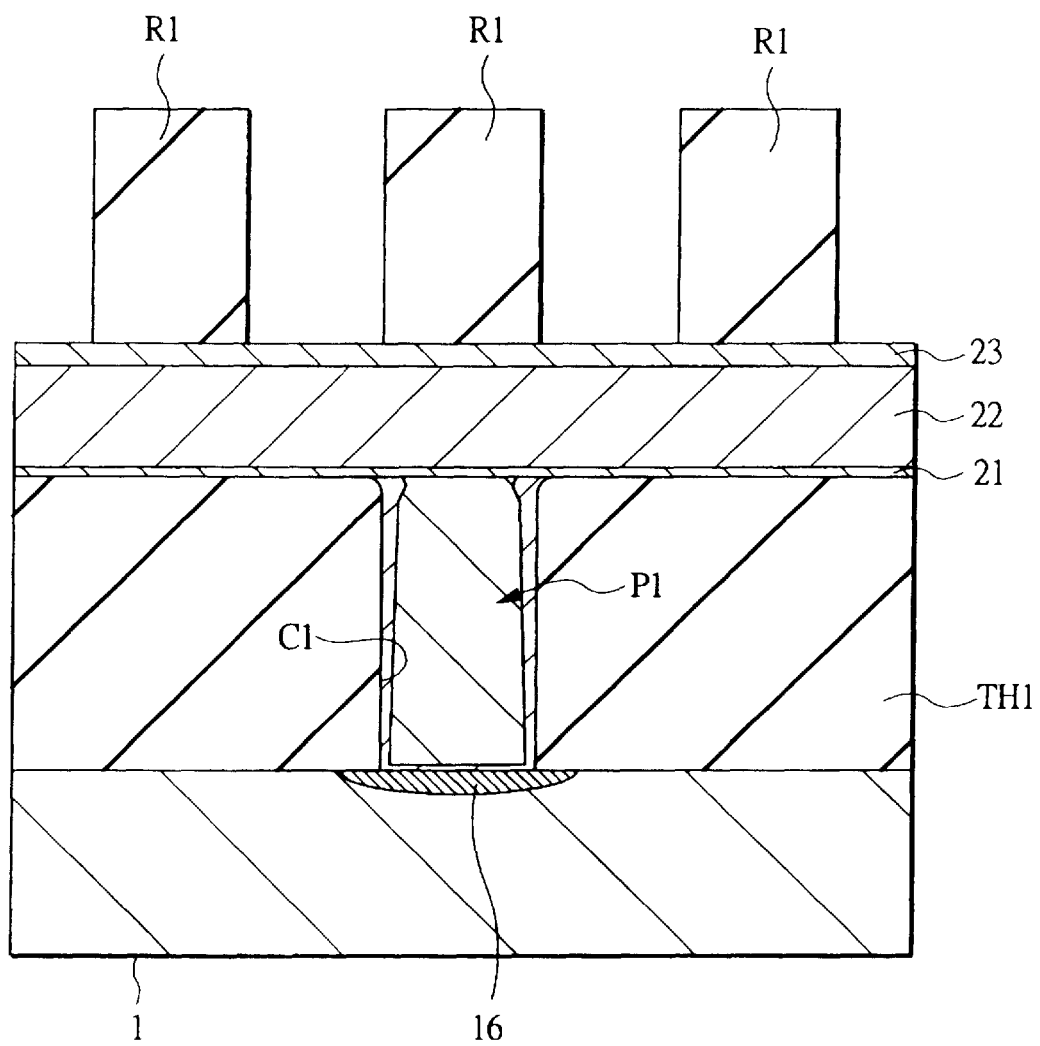
FIG. 9 is a fragmentary cross-sectional view of a substrate, which view illustrates the fabrication method of a semiconductor integrated circuit device according to Embodiment 1 of the present invention.

After application of a resist film R1 over the cap metal film 23 as illustrated in FIG. 8, the resist film R1 is subjected to exposure to light and development, whereby a portion of the resist film R1 is left, as illustrated in FIG. 9, in a region wherein the first-level metallization is to be formed.

Figure 10:
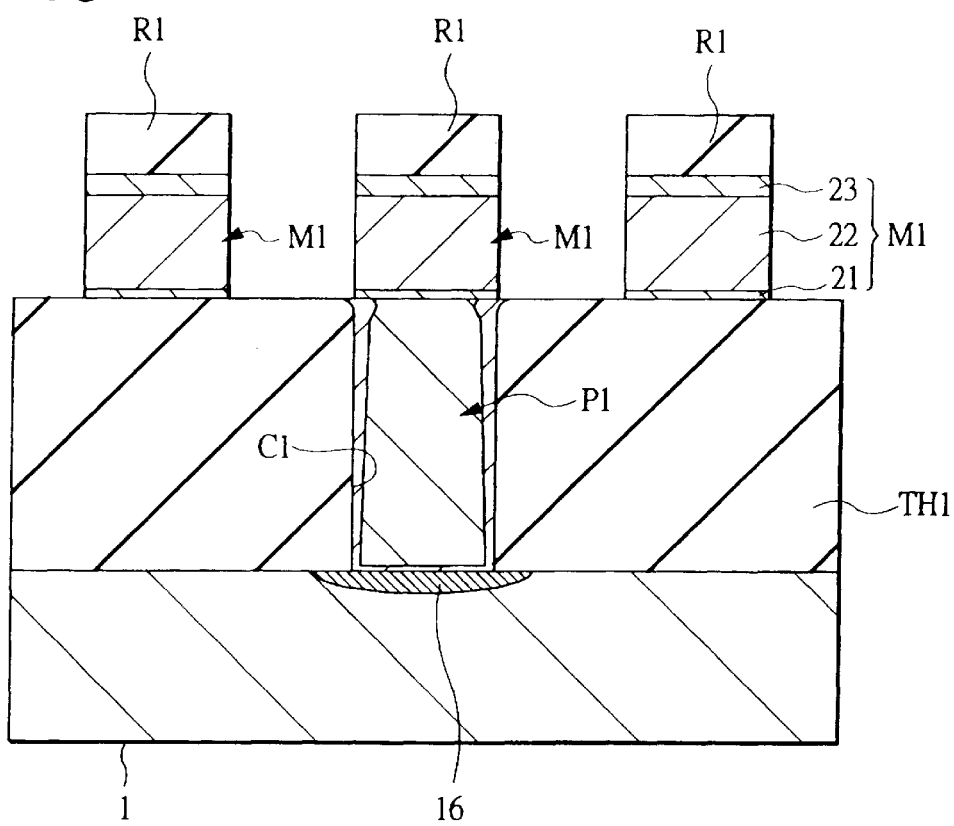
FIG. 10 is a fragmentary cross-sectional view of a substrate, which view illustrates the fabrication method of a semiconductor integrated circuit device according to Embodiment 1 of the present invention.
Figure 11:
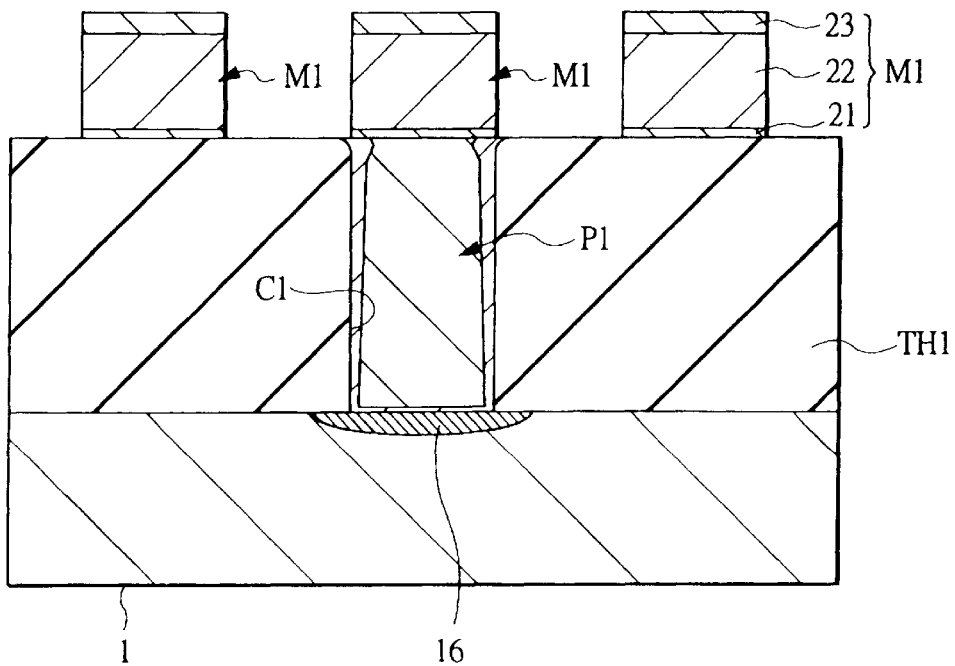
FIG. 11 is a fragmentary cross-sectional view of a substrate, which view illustrates the fabrication method of a semiconductor integrated circuit device according to Embodiment 1 of the present invention.

As illustrated in FIG. 10, with the patterned resist film R1 as a mask, the barrier high-melting-point metal film 21, the Al alloy film 22 and the cap metal film 23 are etched by dry etching, whereby the first-level metallization M1 (Al metallization) made of these films (21, 22, 23) is formed. The metallization width and the distance between metallizations are each about 0.25 μm. Then, the resist film R1 remaining on the first-level metallization M1 is removed by ashing treatment in a plasma (FIG. 11). The residues formed by etching are then removed (after treatment).

Figure 12:
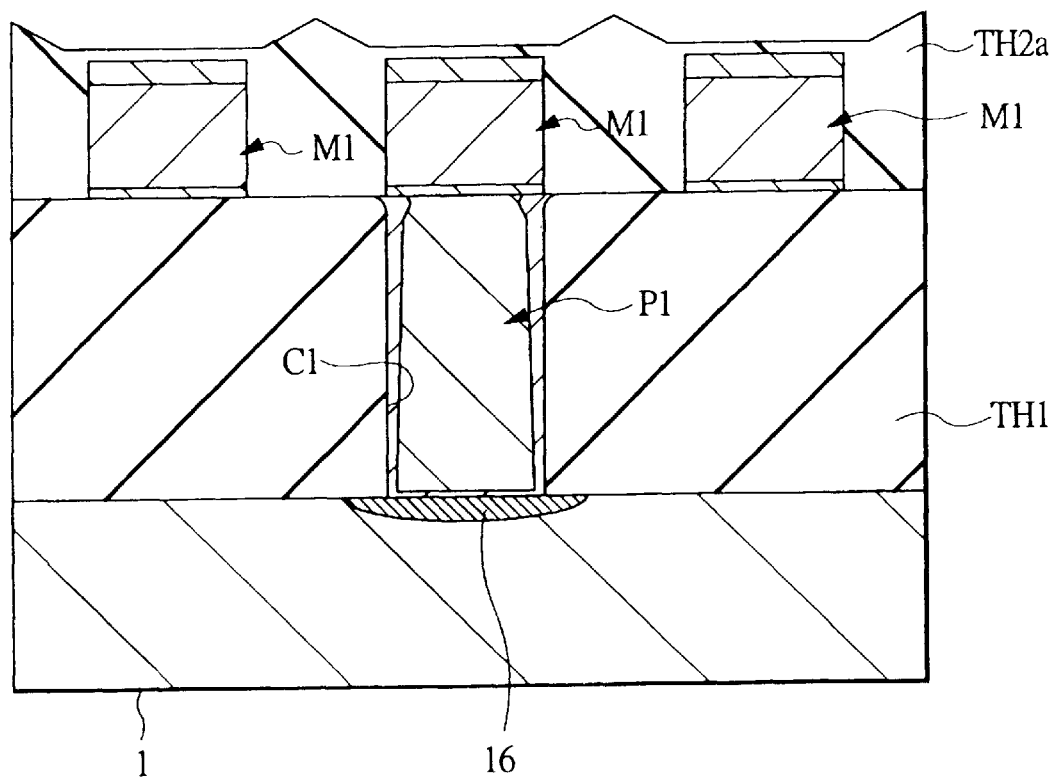
FIG. 12 is a fragmentary cross-sectional view of a substrate, which view illustrates the fabrication method of a semiconductor integrated circuit device according to Embodiment 1 of the present invention.

As illustrated in FIG. 12, a silicon oxide film TH2a is deposited over the interlayer insulating film TH1 including the upper surface of the first-level metallization M1. This silicon oxide film TH2a is formed by high-density plasma CVD (which will hereinafter be abbreviated as "HDP-CVD"). This HDP-CVD is conducted under a low pressure and high electron density atmosphere. The ordinary plasma CVD is conducted under pressure of 1 to 10 Torr at an electron density of $1 \times 10^9$ to $1 \times 10^{10}$, while HDP-CVD is conducted under a pressure of 0.001 to 0.01 Torr at an electron density of $1 \times 10^{12}$ or greater. By this CVD, etching by high density plasma occurs at the same time with deposition of a film forming component (silicon oxide in this case), which makes it possible to fill silicon oxide in a narrow space between metallizations.

Figure 13:
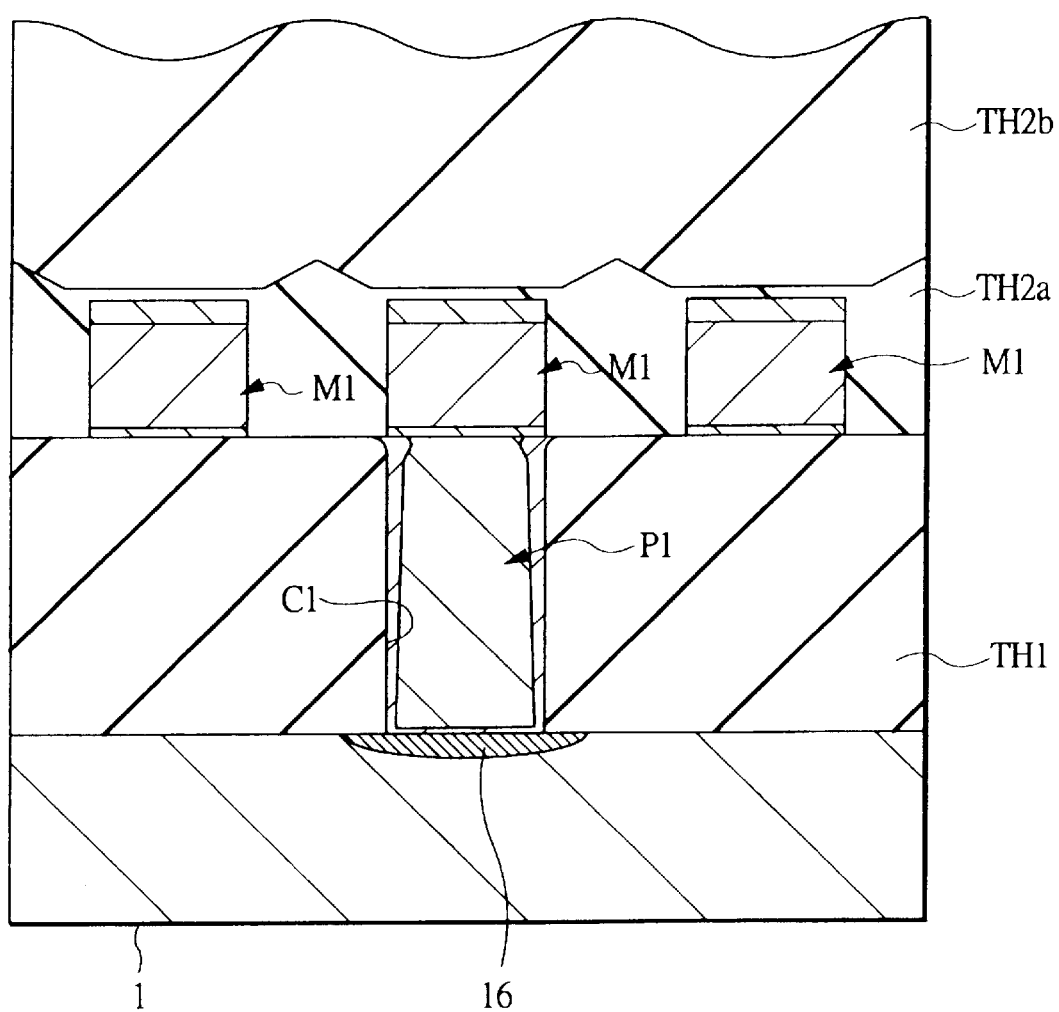
FIG. 13 is a fragmentary cross-sectional view of a substrate, which view illustrates the fabrication method of a semiconductor integrated circuit device according to Embodiment 1 of the present invention.

As illustrated in FIG. 13, a silicon oxide film TH2b is deposited over the silicon oxide film TH2a. This silicon oxide film TH2b is formed by plasma CVD using ozone ($O_3$) and tetraethoxysilane. This silicon oxide film will hereinafter be called "TEOS film".

Figure 14:
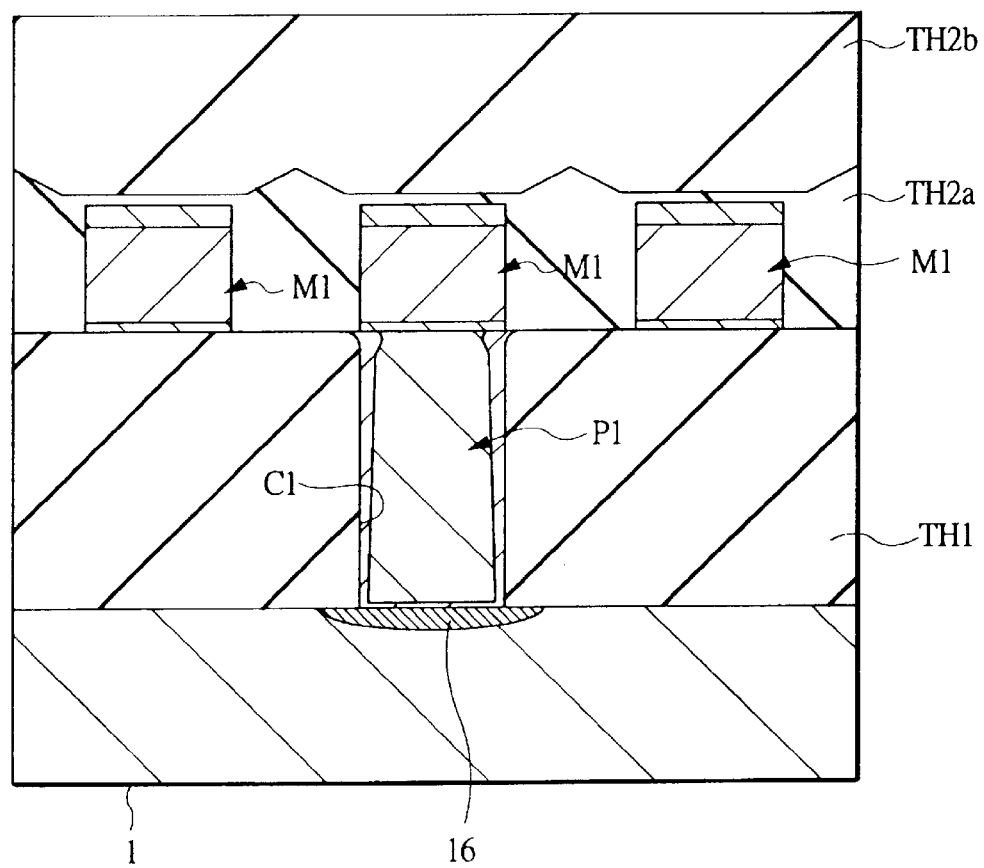
FIG. 14 is a fragmentary cross-sectional view of a substrate, which view illustrates the fabrication method of a semiconductor integrated circuit device according to Embodiment 1 of the present invention.
Figure 15:
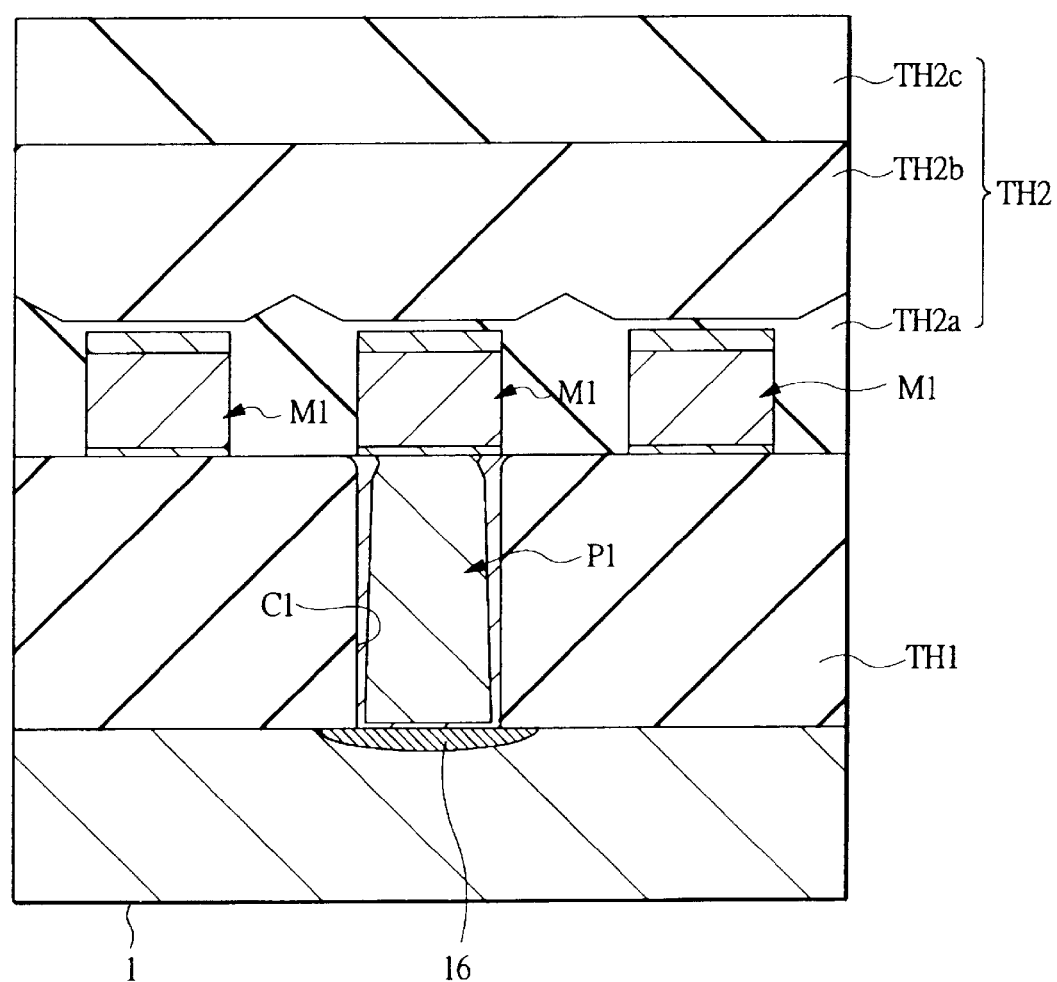
FIG. 15 is a fragmentary cross-sectional view of a substrate, which view illustrates the fabrication method of a semiconductor integrated circuit device according to Embodiment 1 of the present invention.

As illustrated in FIG. 14, the surface of the TEOS film TH2b is planarized by polishing the upper portion of the TEOS film TH2b by CMP. To make up for a decrease in the thickness of the silicon oxide film TH2b, another TEOS film TH2c is deposited (FIG. 15), resulting in the completion of the formation of an interlayer insulating film TH2 (insulating film) formed of the silicon oxide film TH2a and TEOS films TH2b and TH2c.

Figure 16:
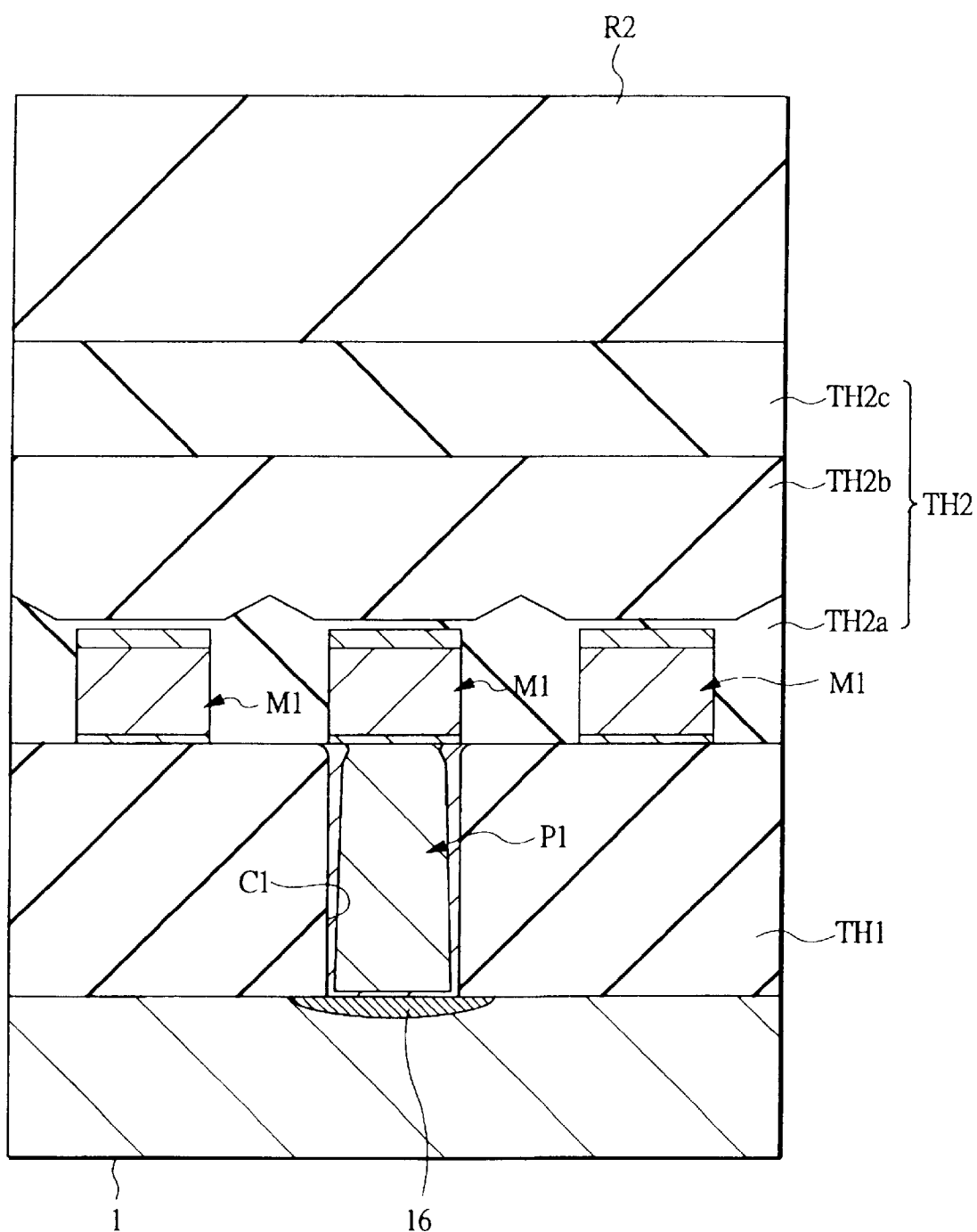
FIG. 16 is a fragmentary cross-sectional view of a substrate, which view illustrates the fabrication method of a semiconductor integrated circuit device according to Embodiment 1 of the present invention.
Figure 17:
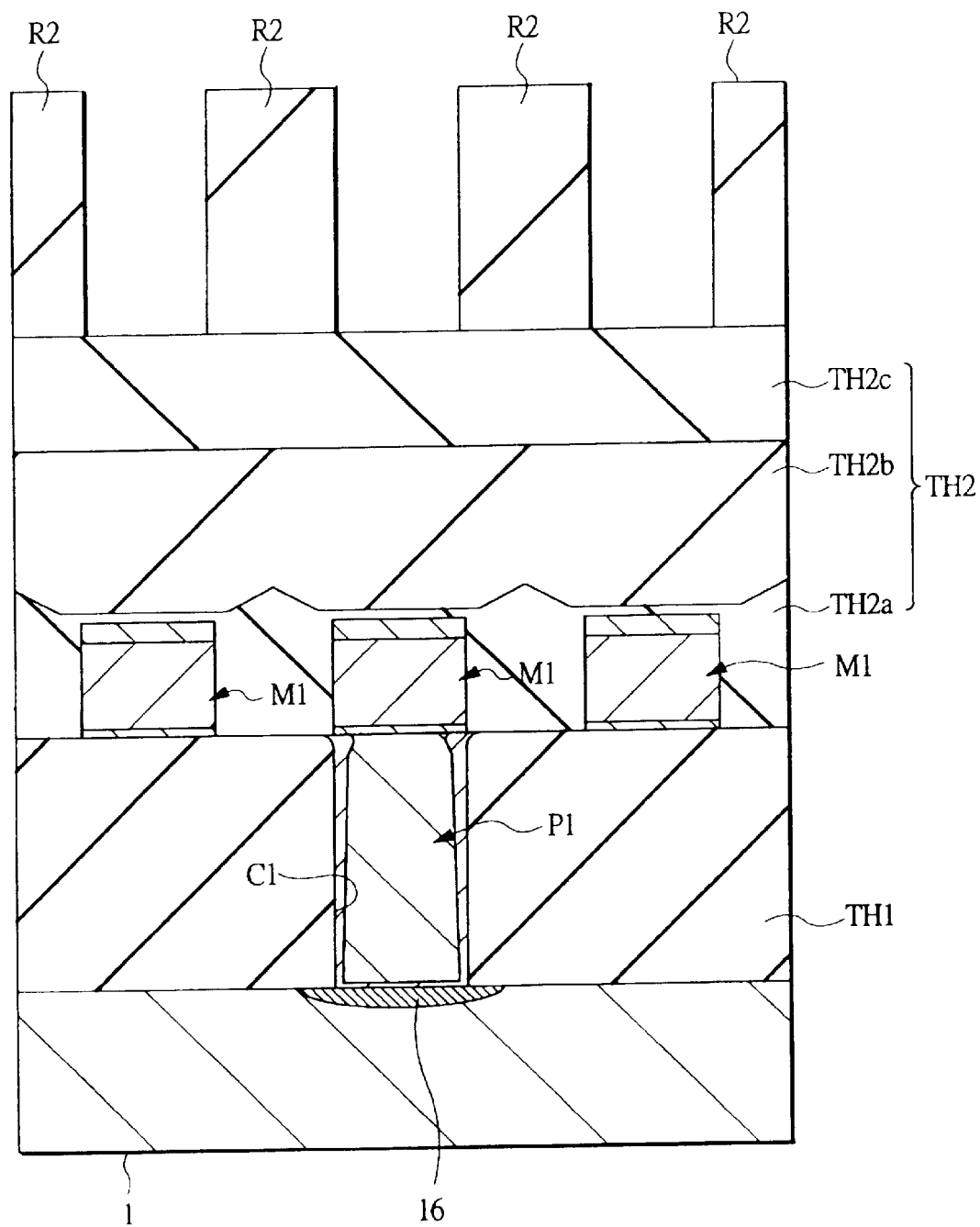
FIG. 17 is a fragmentary cross-sectional view of a substrate, which view illustrates the fabrication method of a semiconductor integrated circuit device according to Embodiment 1 of the present invention.

As illustrated in FIG. 16, after application of a resist film R2 over the interlayer insulating film TH2, the resist film R2 is subjected to exposure to light and development to remove a portion of the resist film R2 in a region over the first-level metallization M1 wherein a plug P2 is to be formed (FIG. 17).

Figure 18:
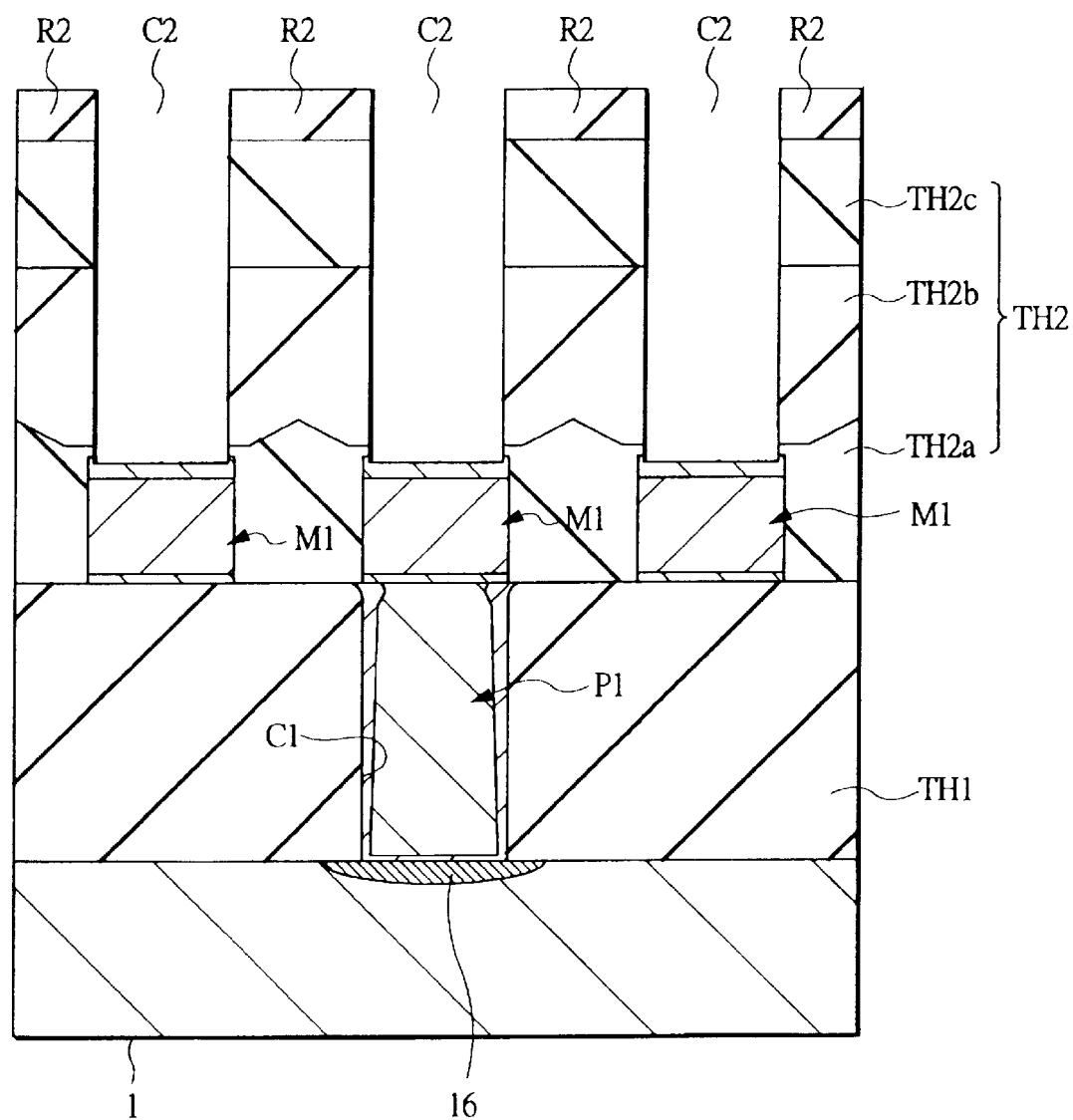
FIG. 18 is a fragmentary cross-sectional view of a substrate, which view illustrates the fabrication method of a semiconductor integrated circuit device according to Embodiment 1 of the present invention.
Figure 19:
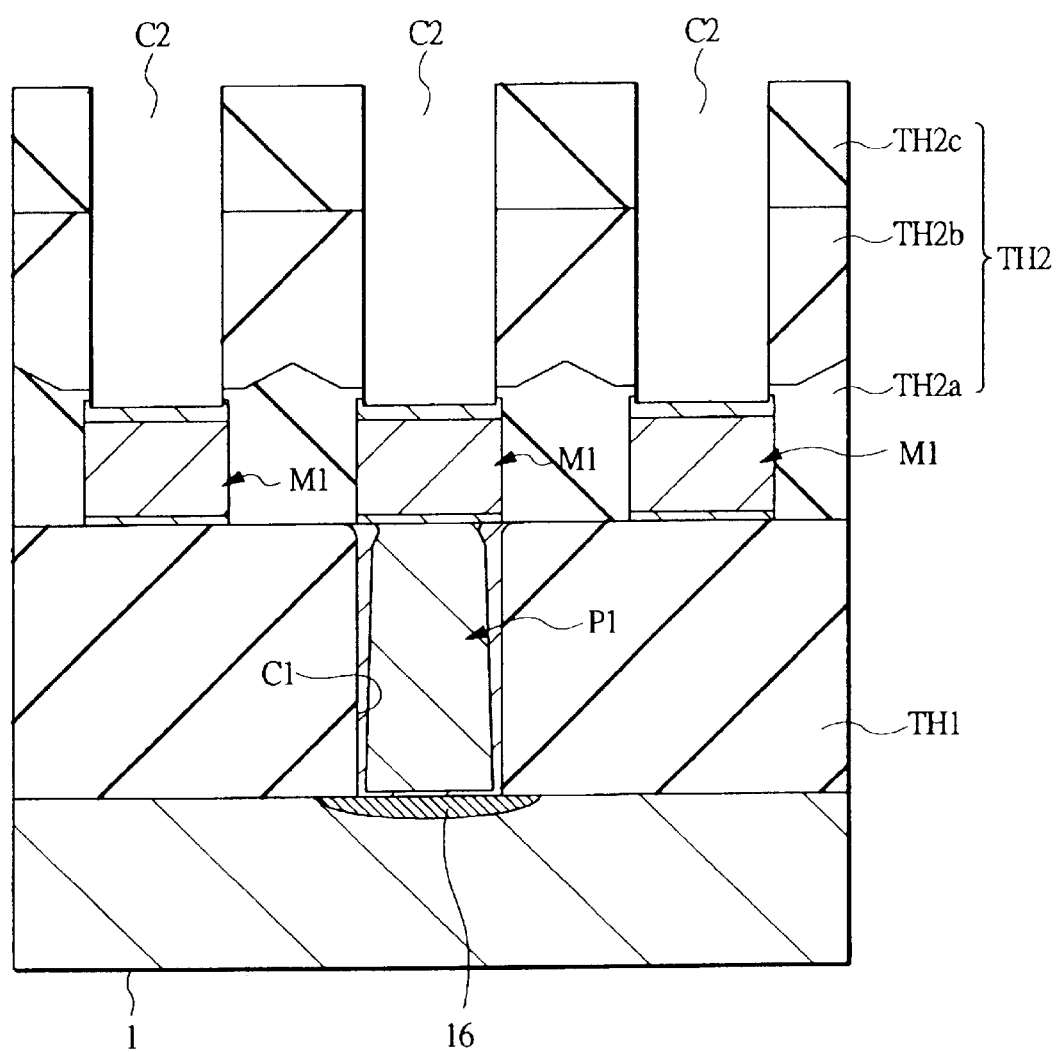
FIG. 19 is a fragmentary cross-sectional view of a substrate, which view illustrates the fabrication method of a semiconductor integrated circuit device according to Embodiment 1 of the present invention.

As illustrated in FIG. 18, with the patterned resist film R2 as a mask, the interlayer insulating film TH2 is removed by dry etching until the exposure of the first-level metallization M1, whereby a contact hole C2 having a diameter of about 0.25 μm and depth of about 0.9 μm is formed. As illustrated in FIG. 19, the resist film R2 remaining on the interlayer insulating film TH2 is removed by ashing treatment in a plasma, followed by removal of residues formed upon etching (after treatment).

Figure 20:
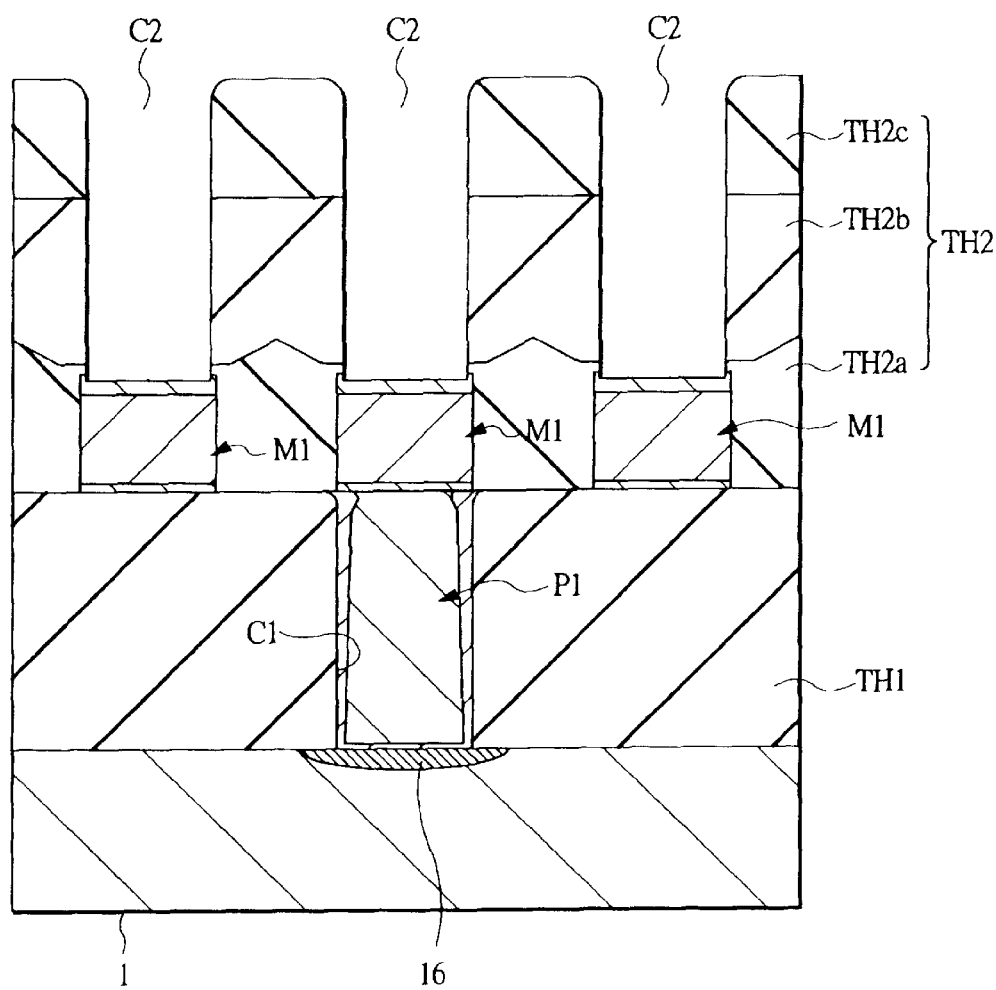
FIG. 20 is a fragmentary cross-sectional view of a substrate, which view illustrates the fabrication method of a semiconductor integrated circuit device according to Embodiment 1 of the present invention.

Pre-cleaning treatment is then conducted under an argon (Ar) atmosphere in order to remove a natural oxide film and the like formed on the bottom of the contact hole C2. The pre-cleaning treatment is effected by etching a film by 25±5 nm (in terms of the flat portion of the TEOS film) in thickness under the following conditions: Ar flow rate at 11 sccm, pressure of 106±14 mPa, power of 300±10W on the side of the semiconductor substrate, and at room temperature. By this pre-leaning treatment, the upper portion of the interlayer insulating film 12 is etched to have a tapered shape (FIG. 20).

Figure 21:
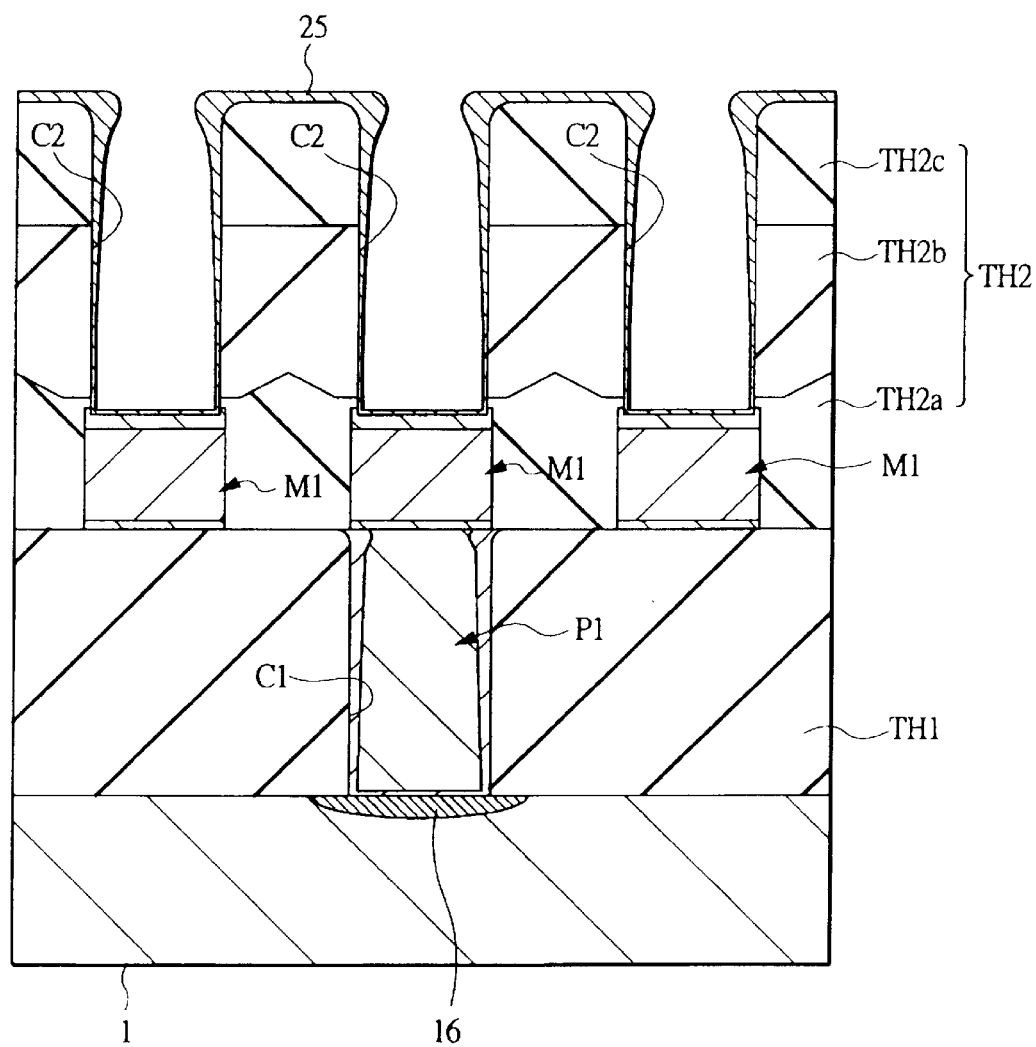
FIG. 21 is a fragmentary cross-sectional view of a substrate, which view illustrates the fabrication method of a semiconductor integrated circuit device according to Embodiment 1 of the present invention.

After pre-cleaning treatment, the semiconductor substrate 1 is transferred under high vacuum and over the interlayer insulating film TH2 including the inside of the contact hole C2, a first sputter film 25 (first electroconductive film) which is a laminate of a Ti film and a TiN film is deposited by traditional sputtering (FIG. 21). This laminate film is formed by depositing the Ti film by sputtering with Ti as a target and then introducing nitrogen in a sputtering apparatus to deposit the TiN film. Following is one example of the treating conditions. First, the Ti film is deposited to give a thickness of about 30±3 nm under the conditions of an Ar flow rate at 97 sccm, pressure of 0.93±0.04 Pa, DC power of 3.0±0.3 kW, temperature of 300±20° C., and a target-wafer distance of 52 mm. Then, the TiN film is deposited to give a thickness of about 50±5 nm under the conditions of an Ar flow rate at 37 sccm, nitrogen flow rate of 53 scrm, pressure of 0.49±0.04 Pa, DC power of 8.0±0.5 kW, temperature of 300±20° C. and a target-wafer distance of 52 mm.

By forming the Ti film first, the reaction between N in the TiN film with Al constituting the first-level metallization M1 can be prevented. Described specifically, since the cap metal film 23 over the Al alloy film 22 is etched and the Al alloy film 22 is exposed upon the above-described formation of the contact hole C2, formation of a TiN film directly inside of the contact hole C2 brings the Al alloy film 22 into contact with the TiN film, leading to the formation of AlN at the contacted position. This AlN has high resistance so that it becomes a cause for contact failure between the first-level metallization M1 and plug P2. A TiN film is therefore disposed to prevent direct contact between the Al alloy film 22 and the TiN film even in such a case.

Figure 22:
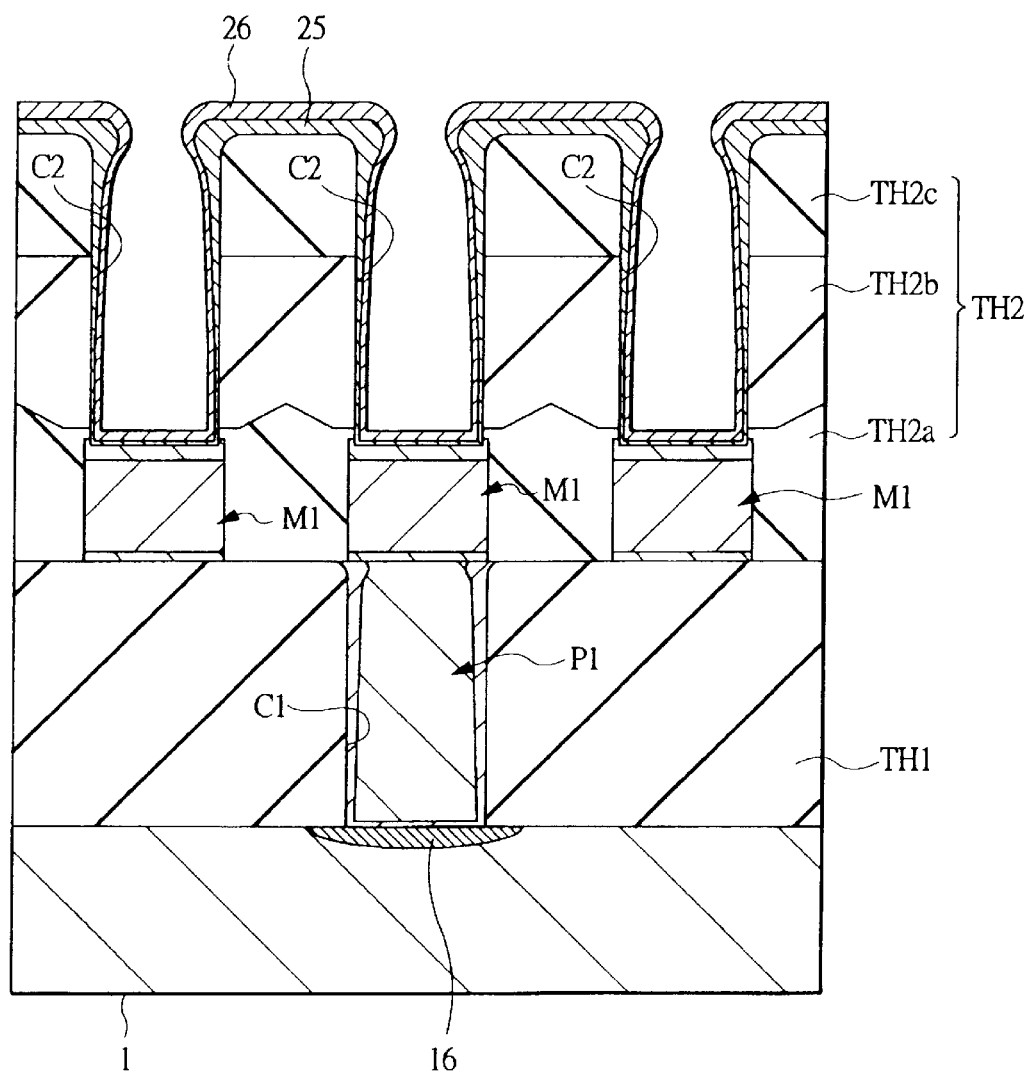
FIG. 22 is a fragmentary cross-sectional view of a substrate, which view illustrates the fabrication method of a semiconductor integrated circuit device according to Embodiment 1 of the present invention.

As illustrated in FIG. 22, a second sputter film 26 (second electroconductive film) made of a W film is deposited over the first sputter film 25. This second sputter film 26 is formed by long throw sputtering. The W film is deposited to a thickness of about 30±3 nm, for example, under the following conditions of an Ar flow rate at 28 sccm, pressure of 0.20±0.03 Pa, DC power of 4.0±0.2 kW, at a temperature of 25° C. and a target-wafer distance of 291 mm. These first and second sputter films (25,26) are for example formed using a sputtering apparatus (multi-chamber) having a chamber for carrying out traditional sputtering and a chamber for carrying out long throw sputtering.

The term "traditional sputtering (not-long-throw sputtering)" as used herein means sputtering conducted under the conditions of a target-substrate distance less than 150 mm, while the term "long throw sputtering" as used herein means sputtering conducted under the conditions of a target-substrate distance not less than 150 mm.

Traditional sputtering tends to deposit a thicker film on the upper portion of the side walls of the contact hole (at the corner portion of the interlayer insulating film TH2) as illustrated in FIG. 21. Since this hood-like protruded portion of the film disturbs the arrival of the particles at the bottom surface of the contact hole, the film formed on the bottom of the contact hole tends to be thin.

The reason is as follows: Owing to a short distance between the target and the semiconductor substrate upon traditional sputtering, particles injected from the target scatter in any direction and are deposited at various places. On the upper portion of the side walls of the contact hole, therefore, particles not only coming downwards but also coming from side directions are deposited, resulting in the deposition of a thicker film.

Figure 29:
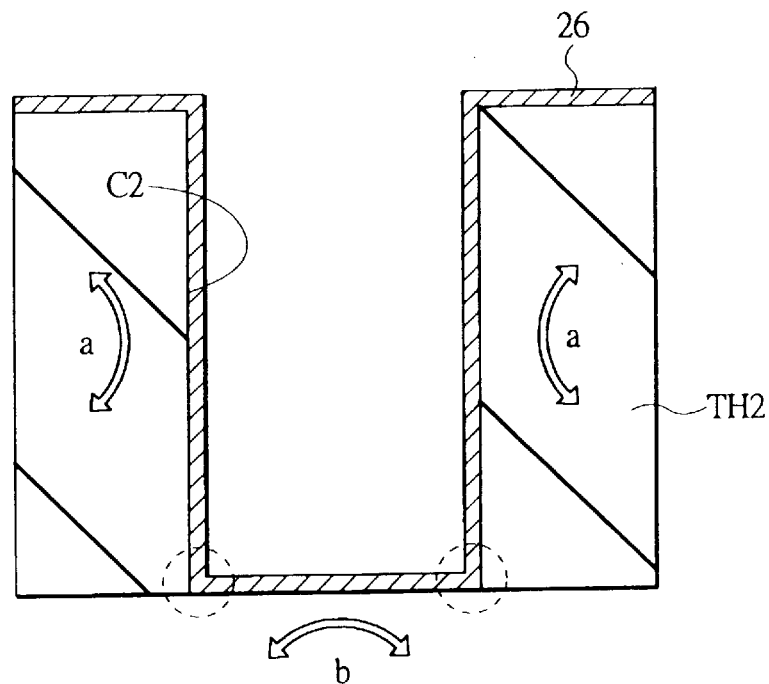
FIG. 29 illustrates the effects of this embodiment.

On the other hand, the distance between the target and semiconductor substrate is long in long throw sputtering so that the direction of the particles injected from the target and reaching the substrate is limited. As a result, not many particles from the side direction deposit on the upper portion of the side walls of the contact hole, thereby reducing the film thickness on the upper portion of the side walls of the contact hole. Thus, the film thickness on the bottom of the contact hole can be secured (refer to FIG. 22). In addition, as illustrated in FIG. 29, the directivity of the particles to be deposited is limited (having directivity of particles) so that a film deposited on the side walls of the contact hole tends to be thin.

Moreover, a film formed by traditional sputtering features a smaller compressive stress than a film formed by long throw sputtering. The term "compressive stress" as used herein means a stress of making a semiconductor substrate to a convex shape when such a film is deposited over the semiconductor substrate. The compressive stress of a film formed by traditional sputtering is about 0 to 1 GPa, while that formed by long throw sputtering is about 1 to 5 GPa.

As the second sputter film 26, another high-melting-point metal film or film of a high-melting-point metal compound may be used, but it is preferred to form a metal film similar to a high-melting-point metal film to be filled in the contact hole C2, because a W film 27 is deposited over the second sputter film 26 by CVD as will be described later and this second sputter film will serve as a seed film upon formation of the W film 27.

Figure 23:
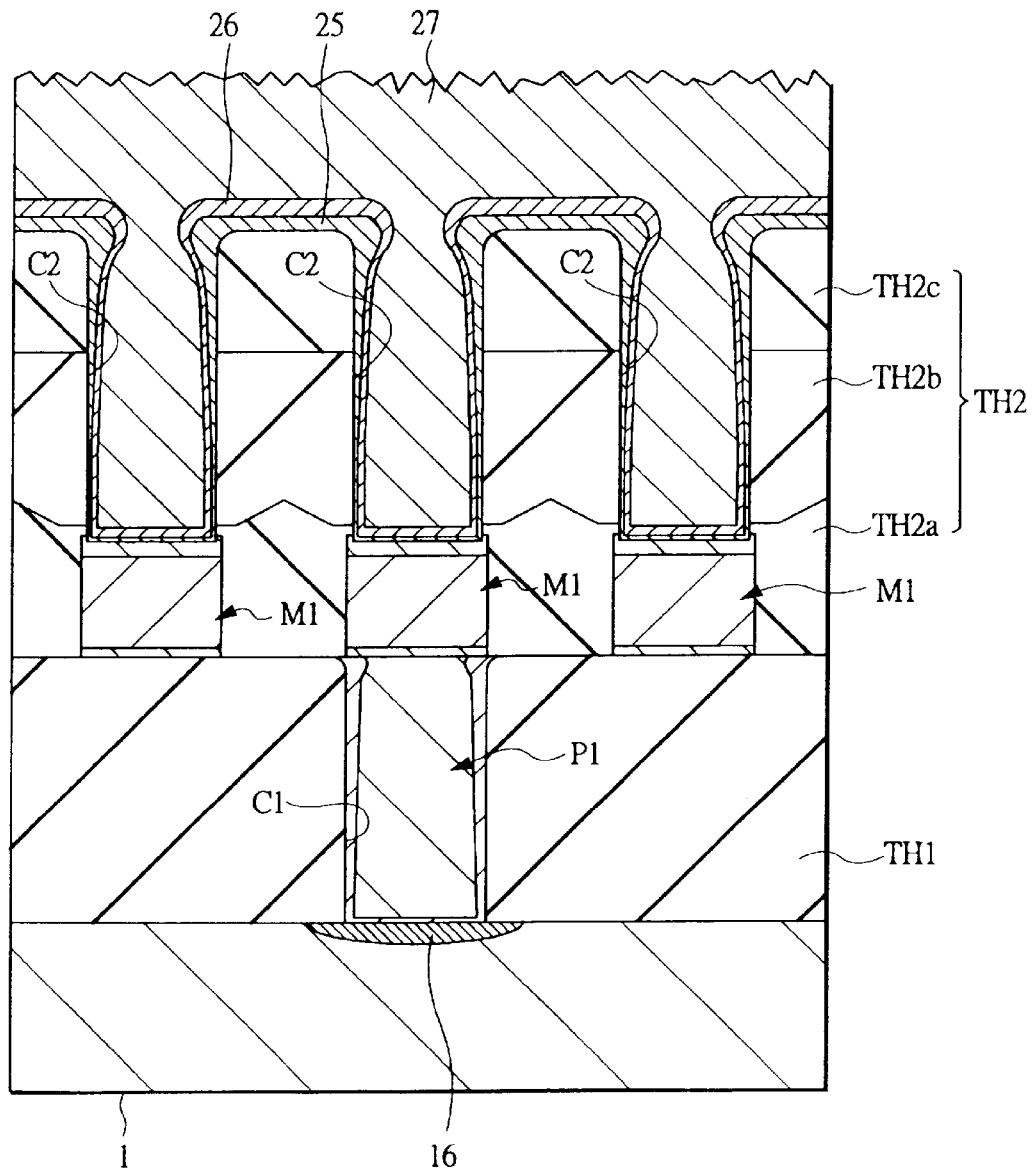
FIG. 23 is a fragmentary cross-sectional view of a substrate, which view illustrates the fabrication method of a semiconductor integrated circuit device according to Embodiment 1 of the present invention.

As illustrated in FIG. 23, the W film 27 (third electro-conductive film) is deposited over the second sputter film 26 by CVD. This W film 27 is deposited to a thickness of about 200±30 nm, for example, under the following conditions: an Ar flow rate at 2200 sccm, a nitrogen flow rate at 300 sccm, a hydrogen flow rate at 1100 sccm, a $WF_6$ flow rate at 95 sccm, pressure of 11970±266 Pa, and temperature of 450±5° C.

Figure 24:
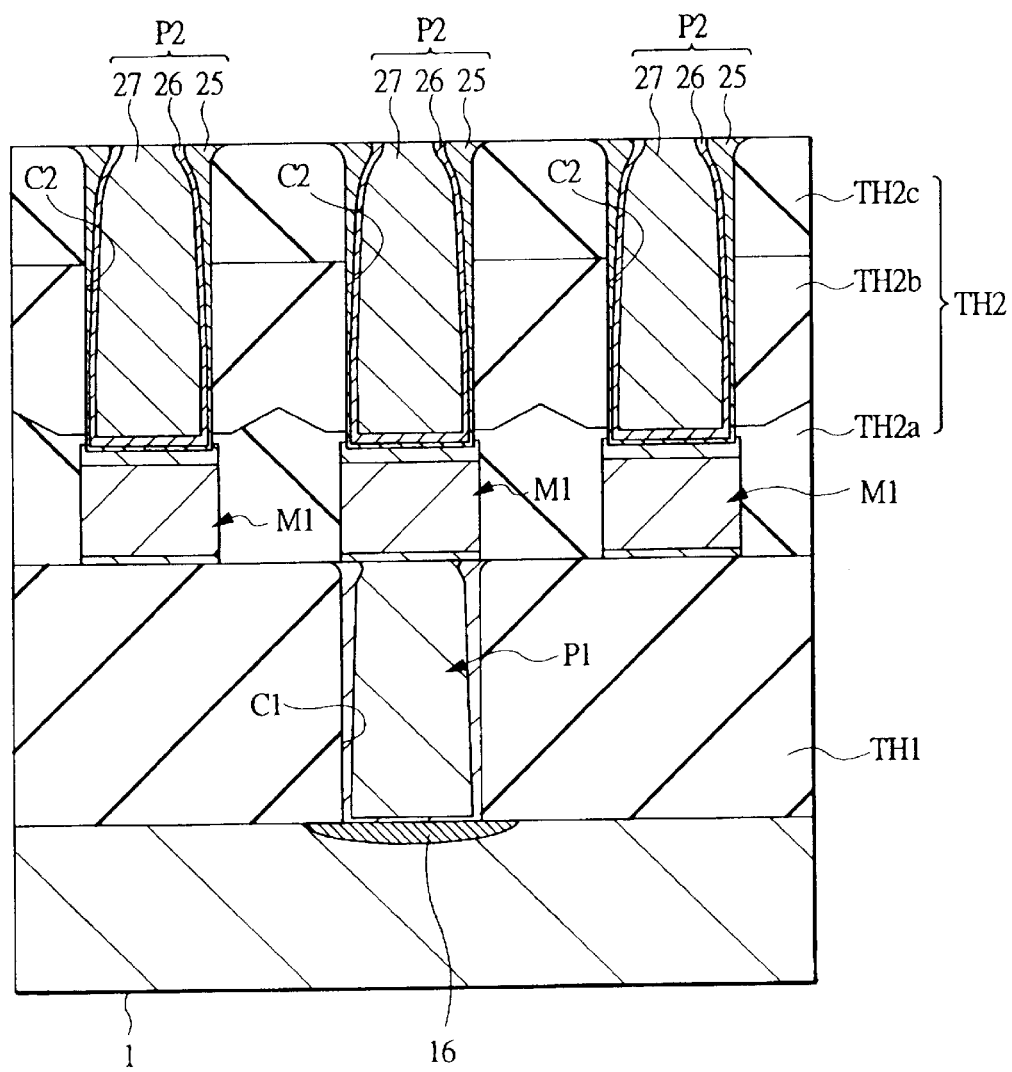
FIG. 24 is a fragmentary cross-sectional view of a substrate, which view illustrates the fabrication method of a semiconductor integrated circuit device according to Embodiment 1 of the present invention.

As illustrated in FIG. 24, the W film 27 and the first and second sputter films 25,26 outside the contact hole C2 are removed by CMP until the surface of the interlayer insulating film TH2 appears. As a result, a plug P2 is formed from the W film 27 and the first and second sputter films 25,26.

Figure 25:
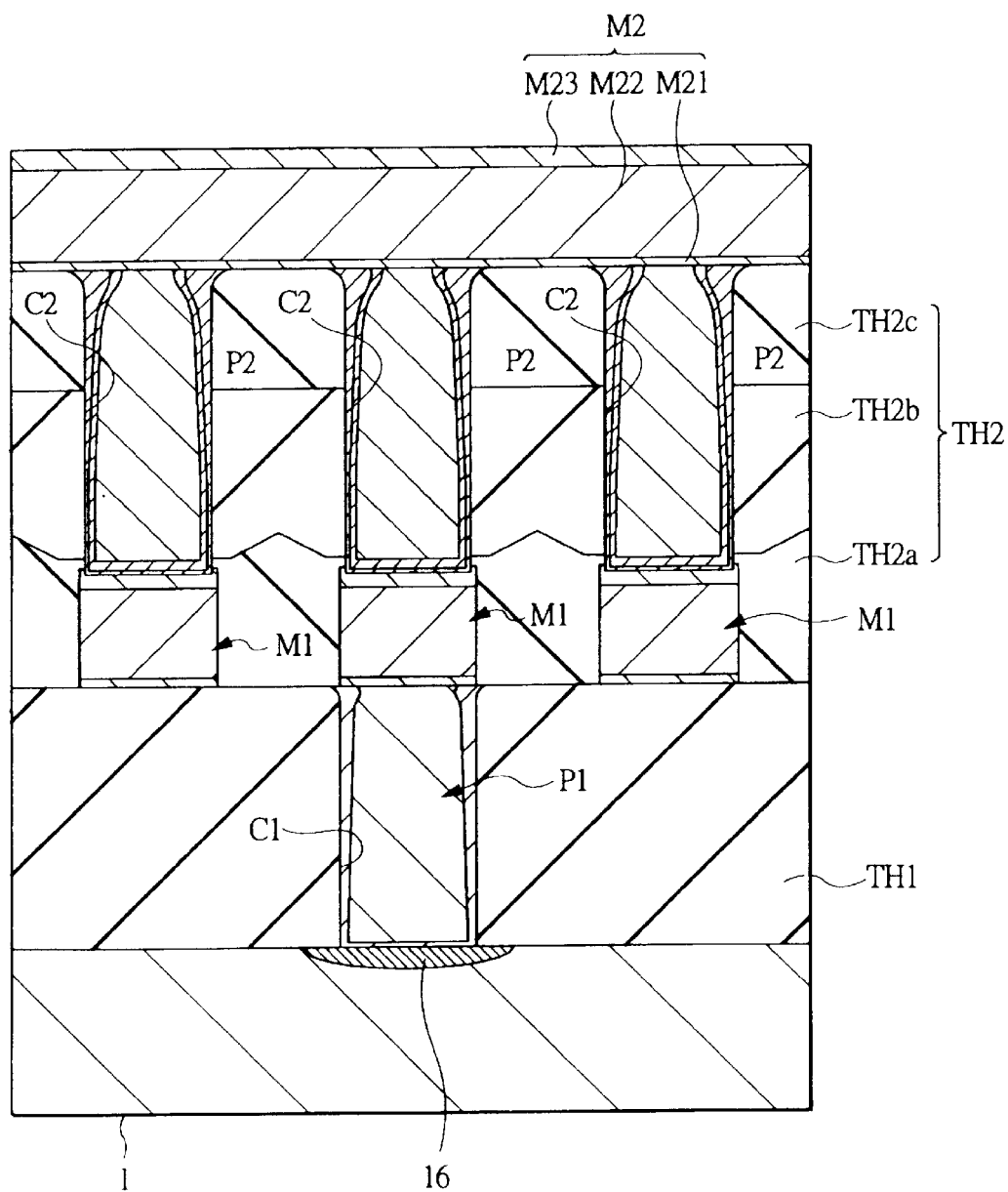
FIG. 25 is a fragmentary cross-sectional view of a substrate, which view illustrates the fabrication method of a semiconductor integrated circuit device according to Embodiment 1 of the present invention.

As illustrated in FIG. 25, in a similar manner to that employed for the formation of the first-level metallization M1, a barrier high-melting-point metal film M21, aluminum (Al) alloy film M22 and a cap metal film M23 are deposited successively over the interlayer insulating film TH2 and plug P2, followed by patterning, whereby a second-level metallization M2 is formed.

Interlayer insulating films (TH3~), plugs (P318) and metallizations (M3~) are formed in repetition in a similar manner to that employed for the formation of the interlayer insulating film TH2, plug P2 and metallizations M1,M2, whereby a semiconductor integrated circuit device with a multilayer metallization is formed. Example of five-level metallization (M1 to M5) is illustrated in FIG. 26.

Figure 26:
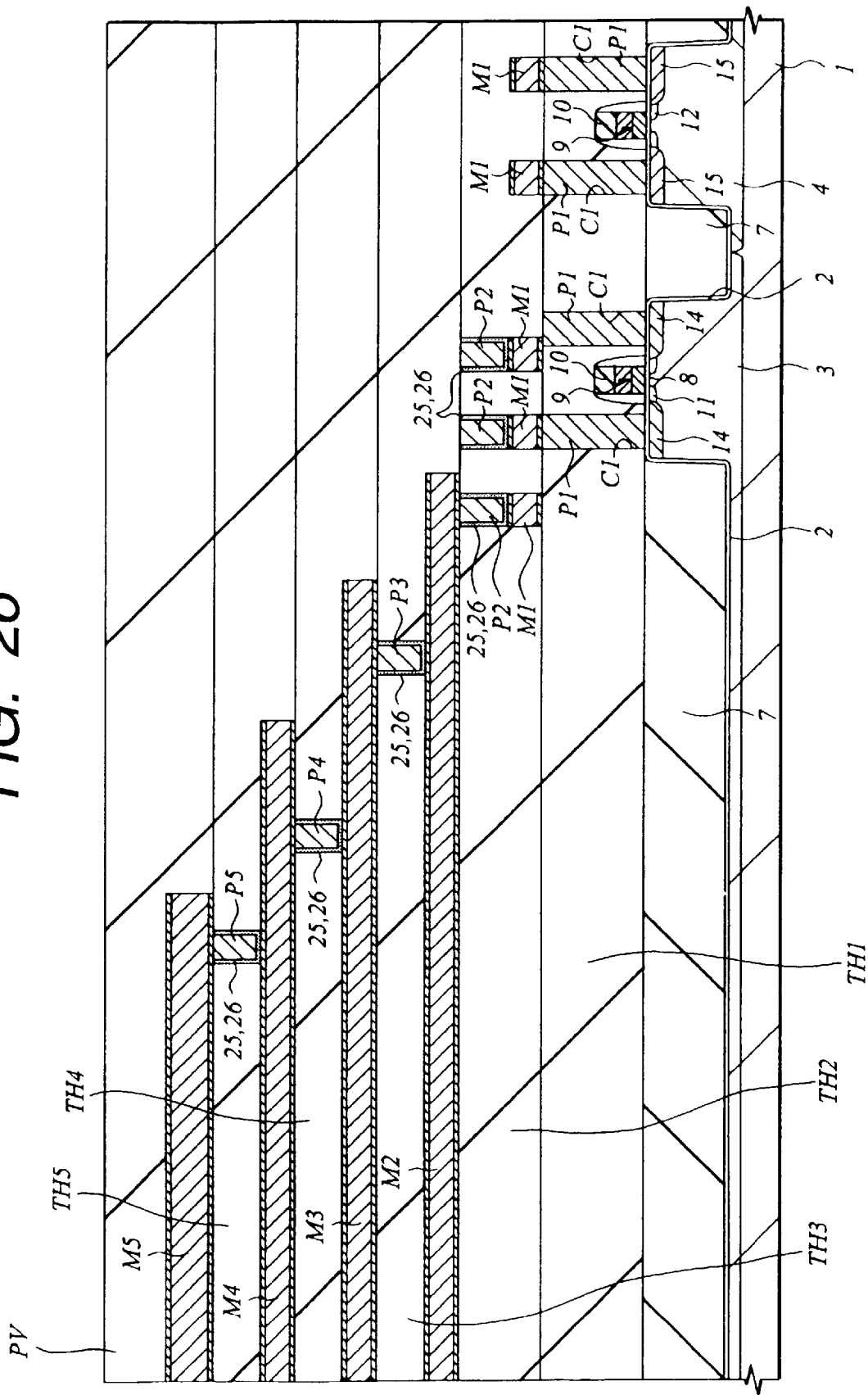
FIG. 26 is a fragmentary cross-sectional view of a substrate, which view illustrates the fabrication method of a semiconductor integrated circuit device according to Embodiment 1 of the present invention.

Although diagrams illustrating the subsequent steps are omitted, a passivation film PV made of a silicon nitride film and a silicon oxide film is formed over the uppermost metallization (the fifth-level metallization M5 in the case of FIG. 26). A portion of this passivation film PV is removed by etching to expose a bonding pad portion on the uppermost metallization. A bump lower electrode made of gold or the like is formed at the bonding pad portion, followed by formation thereover a bump electrode made of gold or solder. The product thus obtained is then mounted on a package substrate or the like, whereby a semiconductor integrated circuit device is completed.

Since in this embodiment, the first sputter film 25 and second sputter film 26 are formed inside of the contact hole C2 above the first-level metallization as described above, barrier properties can be improved.

For example, the barrier properties of the high-melting-point metal film 225 on the bottom of the contact hole are deteriorated as illustrated in FIG. 27(a) when a contact hole has a large aspect ratio (3 or greater). If the barrier properties are lowered and the first-level metallization M1 is exposed, a sublimable product is generated by the reaction of Al (Al alloy film 22) which constitutes the first-level metallization M1 with $WF_6$ which is a raw material of the W film 27. As a result, the first-level metallization M1 (Al) is eroded and a contact area of the first-level metallization M1 with the plug P2 cannot be secured, resulting in connection failure.

When the metallization width or distance between metallizations is small, the margin between the metallization and the contact hole decreases, tending to cause positional deviation (deviation of the contact hole pattern relative to the metallization pattern). In such a case, as illustrated in FIG. 27(b), sub-trenches (concave portions having a smaller diameter) are formed on the side walls of the metallization, leading to a further deterioration in barrier properties. In this case, sub-trenches extend to the Al alloy film 22, so that reaction between Al and $WF_6$ tends to occur, thereby causing a resistance rise of the first-level metallization M1 or connection failure between the first-level metallization M1 and the plug P2.

Figure 28:
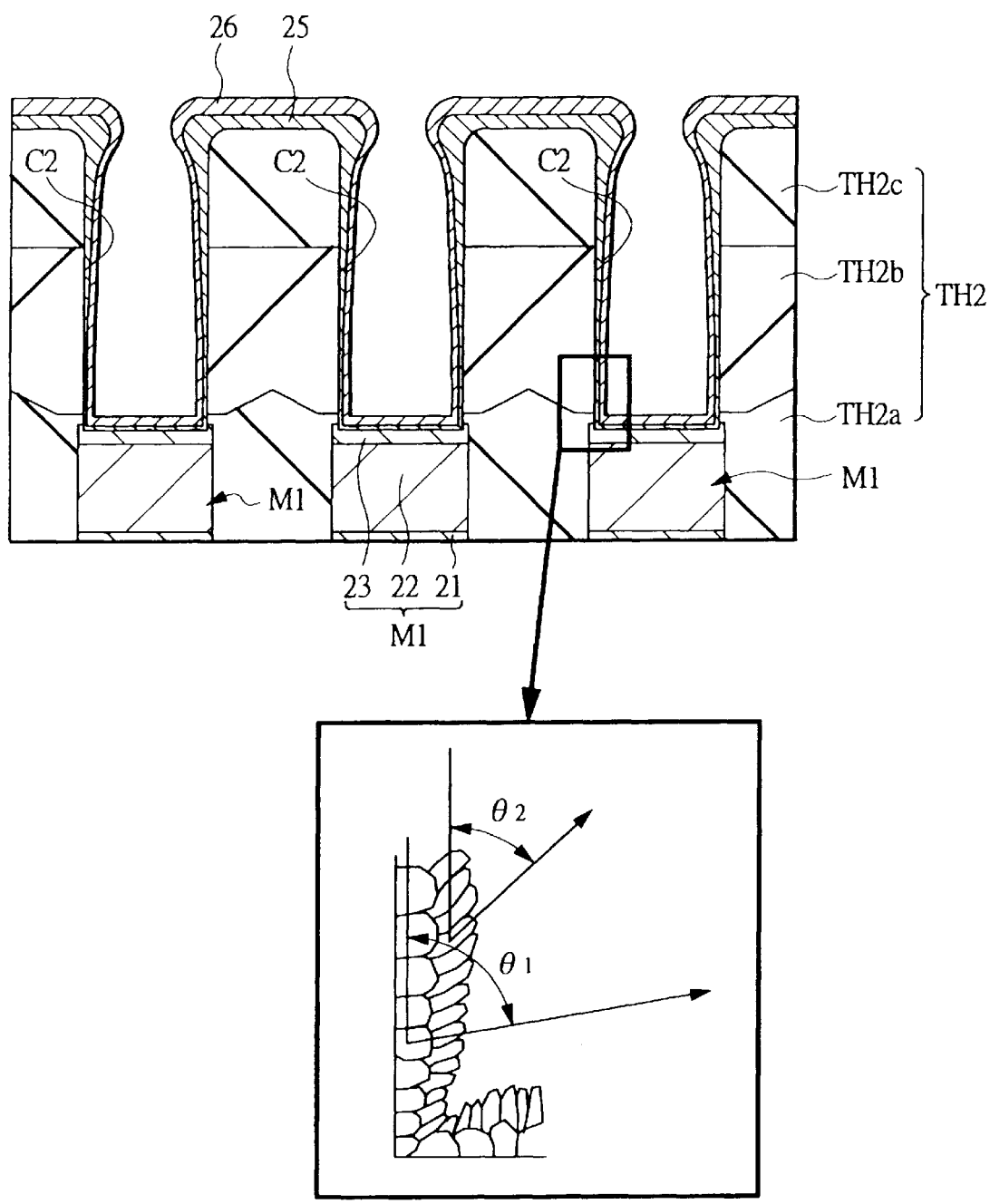
FIG. 28 is a fragmentary cross-sectional view of a substrate, which view illustrates the fabrication method of a semiconductor integrated circuit device according to Embodiment 1 of the present invention.

This embodiment however makes it possible to improve barrier properties, because a barrier film is formed of the first sputter film 25 and the second sputter film 26. Particularly in the second sputter film 26, as described above, crystal grains have directivity in the depositing (vertical) direction so that the coverage of the bottom portion of the contact hole C2 can be enlarged. FIG. 28 illustrates the state of the crystal grains of the first sputter film and the second sputter film. θ1 indicates the directivity of the crystal grains of the first sputter film 25, while θ2 indicates that of the second sputter film 26.

In addition, disposal of the second sputter film having a larger compressive stress over the first sputter film having a smaller compressive stress makes it possible to secure the coverage at the corner portion on the bottom of the first sputter film. If the second sputter film 26 having a larger compressive stress is disposed below, a markedly large stress is applied to the corner portion on the bottom of the contact hole, thereby tending to cause cracks, because a stress is applied to the film on the bottom of the contact hole C2 in the direction a and to the film on the side walls of the contact hole in the direction b as illustrated in FIG. 29. Even if the first sputter film 25 is deposited over the second sputter film, the diameter of the contact hole has been small by the second sputter film 25 and moreover, owing to low directivity of particles, the second sputter film has inferior coverage on the bottom of the contact hole as described above. It becomes difficult to cover the crack-appearing corner portion on the bottom of the contact hole.

Since the second sputter film having a larger compressive stress is disposed over the first sputter film having a smaller compressive stress in this embodiment, coverage of the first sputter film at the corner portion on the boom of the contact hole can be secured.

If one or whole portion of the barrier film is made of a CVD film, organic reaction byproducts enter into the film, thereby increasing the resistance of the film. When the barrier film is formed partially from a CVD film, the CVD film is formed after the formation of a sputter film, making it difficult to integrate a sputtering apparatus and CVD apparatus. Since the barrier film is a laminate of sputter films, on the other hand, a high quality barrier film is available at a low cost by using a multi-chamber.

In this Embodiment, long throw sputtering is employed to impart depositing particles with directivity. Alternatively, the above-described sputtering using a collimator (collimation sputtering) or sputtering with ionized particles may be used.

A collimator is made of two adjacent plates each having a plurality of opening portions. The passage of particles can be limited to a depositing (vertical) direction if this collimator is disposed between a substrate and a target.

By ionizing the sputtering particles, it is possible to preferentially introduce the particles (ions) to the contact hole (or impart the particles with directivity toward the contact hole).

In long throw sputtering, the directivity of the particles can be improved further by applying bias to a semiconductor substrate.

In this embodiment, Ti and TiN films are employed as the first sputter film, while a W film is employed as the second sputter film. Alternatively, another high-melting-point metal film or film made of a high-melting-point metal compound may be used. Examples of such a film include Ta, TaN, TaSiN, TiSiN, TiW and WN films.

In this embodiment, a laminate of Ti and TiN films is employed as the first sputter film, but a single-layer film may also be employed.

(Embodiment 2)

In the above-described Embodiment 1, application of this invention to an Al metallization was described. Alternatively, the present invention can be applied to copper damascene metallization. The damascene metallization means a metallization formed by making a metallization groove in an insulating film and then filling an electroconductive film such as copper (Cu) inside of the groove.

The fabrication method of a semiconductor integrated circuit device according to Embodiment 2 of the present invention will next be described. FIGS. 30 to 35 are fragmentary cross-sectional views of a substrate, which views each illustrates the fabrication method of a semiconductor integrated circuit device according to this embodiment of the present invention. Steps up to the plug P1 forming step are similar to those of Embodiment 1 described with reference to FIGS. 1 to 6 so that detailed description on them will be omitted.

Figure 30:
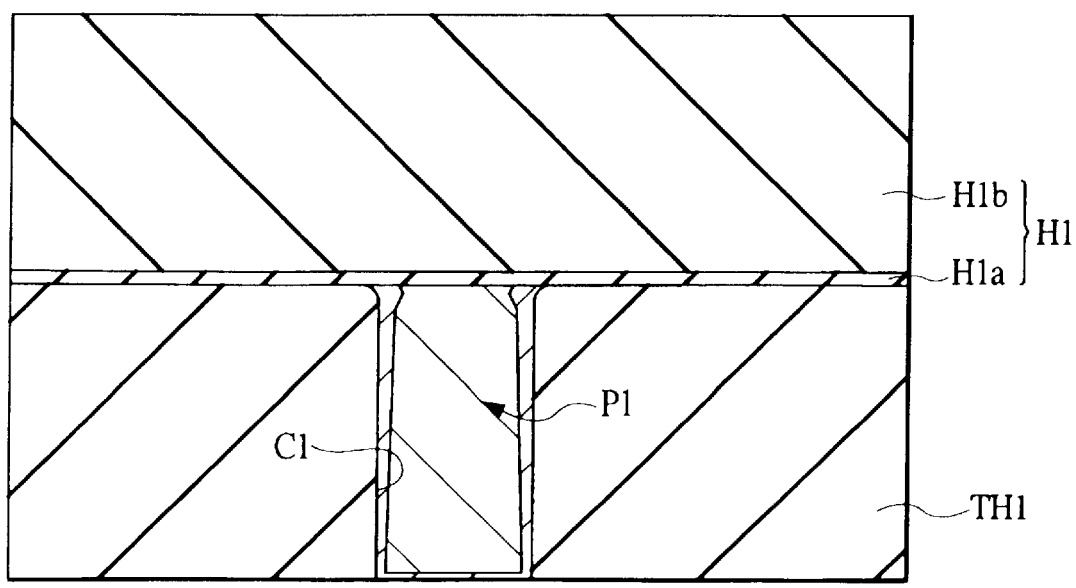
FIG. 30 is a fragmentary cross-sectional view of a substrate, which view illustrates the fabrication method of a semiconductor integrated circuit device according to Embodiment 2 of the present invention.

First, the semiconductor substrate 1 as described in Embodiment 1 and illustrated in FIG. 6 is prepared. As illustrated in FIG. 30, a silicon nitride film H1*a* and a silicon oxide film H1*b* are deposited successively by CVD over the interlayer insulating film TH1 and plug P1, whereby a metallization groove insulating film H1 made of these films is formed.

Figure 31:
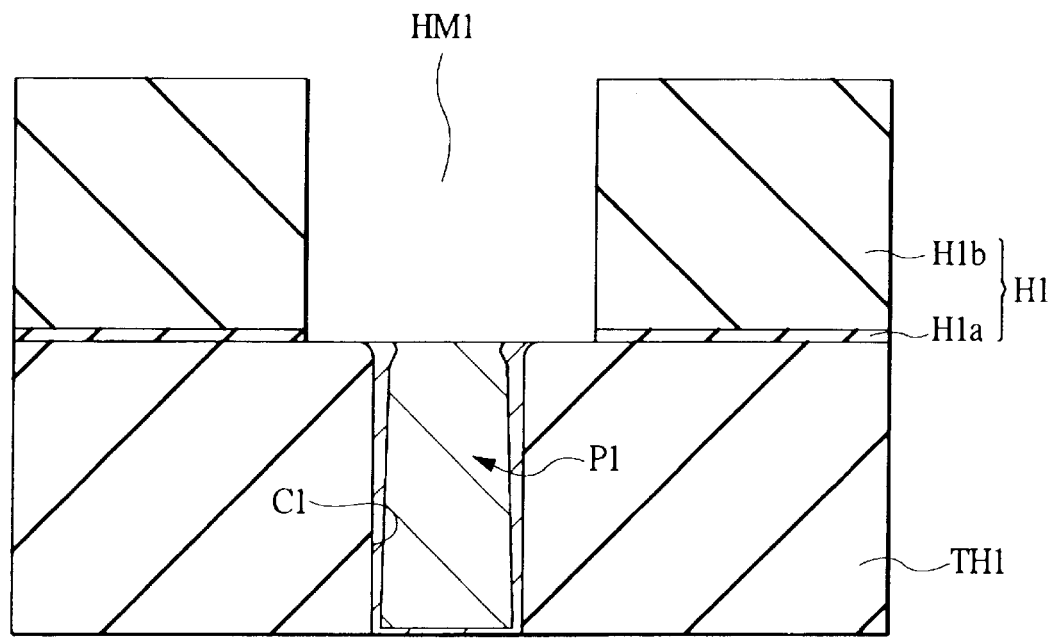
FIG. 31 is a fragmentary cross-sectional view of a substrate, which view illustrates the fabrication method of a semiconductor integrated circuit device according to Embodiment 2 of the present invention.

As illustrated in FIG. 31, a metallization groove HM1 is formed by etching the metallization groove insulating film H1 from a region wherein a first-level metallization is to be formed. The silicon nitride film H1*a* serves as an etching stopper upon this etching.

Figure 32:
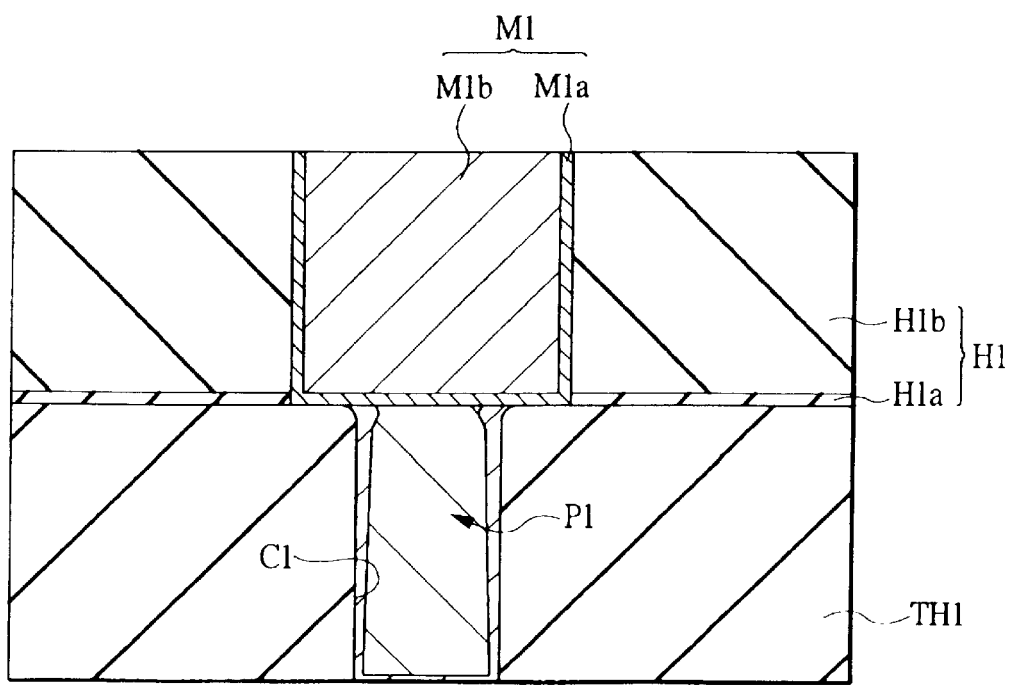
FIG. 32 is a fragmentary cross-sectional view of a substrate, which view illustrates the fabrication method of a semiconductor integrated circuit device according to Embodiment 2 of the present invention.

As illustrated in FIG. 32, a titanium nitride film M1*a* is deposited over the metallization groove insulating film H1 including the inside of the metallization groove HM1 by sputtering or CVD, followed by the formation of a thin Cu film (not illustrated) over the titanium nitride film M1*a* by sputtering or CVD. A copper film M1*b* is formed thereover by electroplating. Instead of the titanium nitride film M1*a*, a tantalum nitride film or a tantalum film or a laminate thereof may be formed.

By removing the copper film M1*b* and titanium nitride film M1*a* from the outside of the metallization groove HMi by CMP, a first-level metallization M1 (Cu metallization) made of the copper film M1*b* and titanium nitride film M1*a* is formed.

Figure 33:
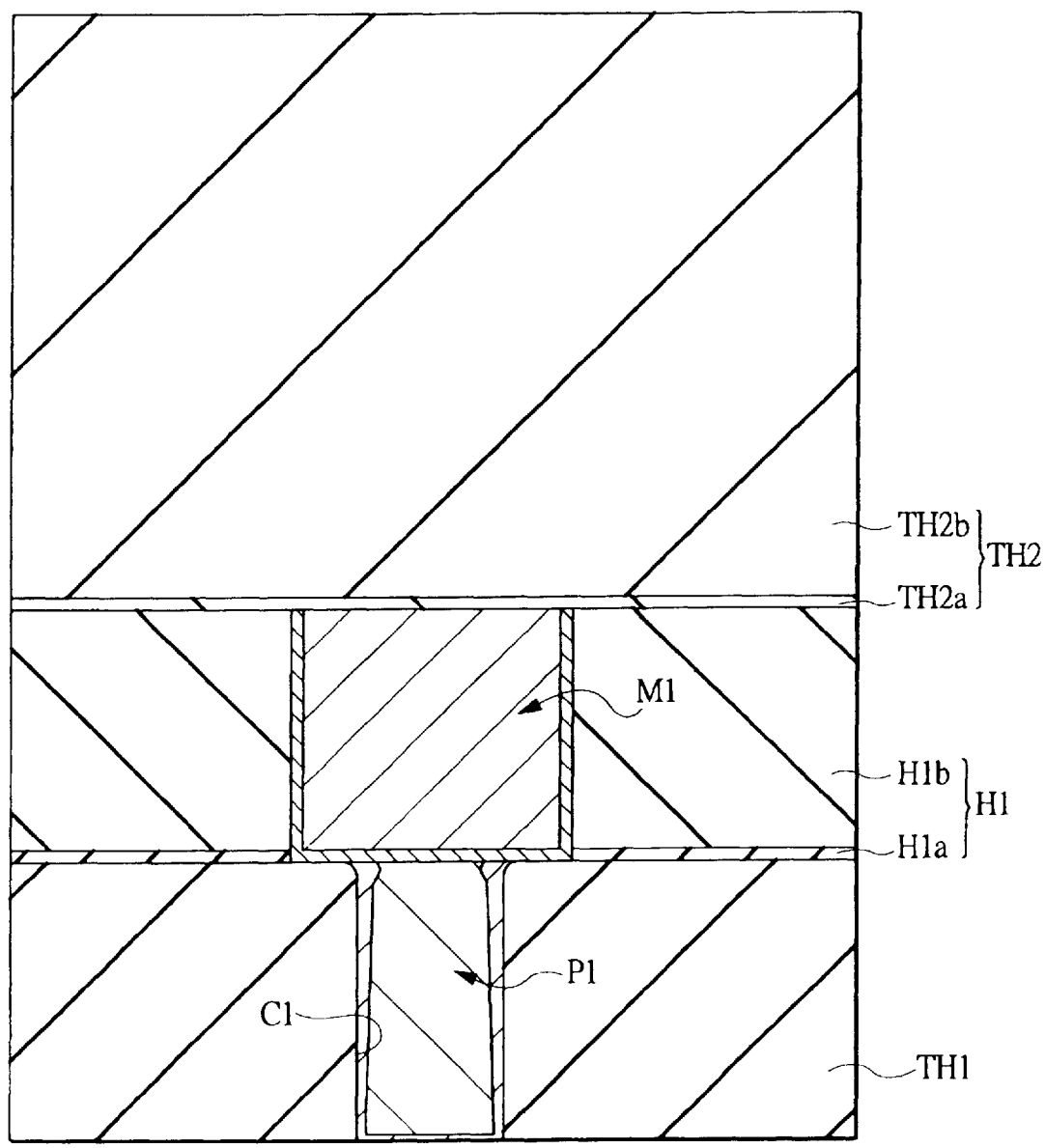
FIG. 33 is a fragmentary cross-sectional view of a substrate, which view illustrates the fabrication method of a semiconductor integrated circuit device according to Embodiment 2 of the present invention.

As illustrated in FIG. 33, a silicon nitride film TH2*a* and a silicon oxide film TH2*b* are deposited successively over the first-level metallization M1 and silicon oxide film H1*b* by CVED to form an interlayer insulating film TH2 made of these films. The silicon nitride film TH2*a* serves as an etching stopper upon formation of the contact hole C2.

Figure 34:
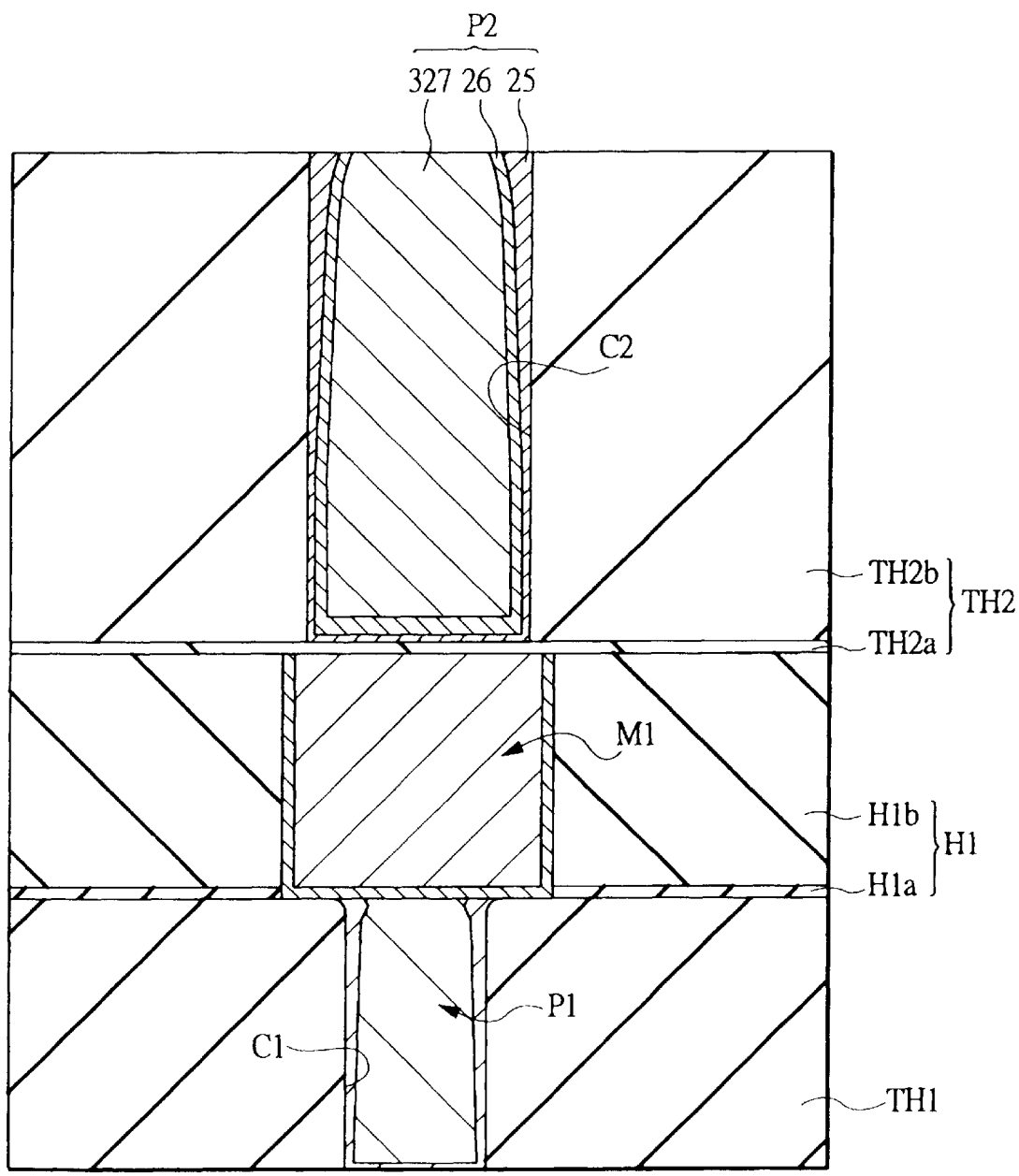
FIG. 34 is a fragmentary cross-sectional view of a substrate, which view illustrates the fabrication method of a semiconductor integrated circuit device according to Embodiment 2 of the present invention.

As illustrated in FIG. 34, a resist film (not illustrated) having an opening at the contact region above the first-level metallization M1 is formed over the interlayer insulating film TH2. With this resist film as a mask, the silicon oxide film TH2*b* is subjected to anisotropic etching. The silicon nitride film TH2*a* exposed by this etching is etched until exposure of the surface of the first-level metallization M1, whereby a contact hole C2 is formed. Pre-cleaning treatment is then conducted in an argon (Ar) atmosphere to remove a natural oxide film and the like formed on the bottom of the contact hole C2.

A plug 22 (Cu plug) is then formed inside of this contact hole C2. Described specifically, a first sputter film 25 made of a laminate of a Ti film and a TiN film is deposited over the interlayer insulating film TH2 including the inside of the contact hole C2 by traditional sputtering, followed by the deposition of a second sputter film 26 made of a Ta (tantalum) film by long throw sputtering.

After formation of a thin Cu film (not illustrated) over the second sputter film 26 by sputtering or CVD, a Cu alloy film 327 is deposited over the thin Cu film by electroplating. The Cu alloy film 327 and first and second sputter films 25,26 outside the contact hole C2 are removed by CMP until the surface of the interlayer insulating film TH2 is exposed. Alternatively, prior to electroplating, a thin Cu film is deposited over the second sputter film 26 by sputtering to form a seed film for electroplating.

Figure 35:
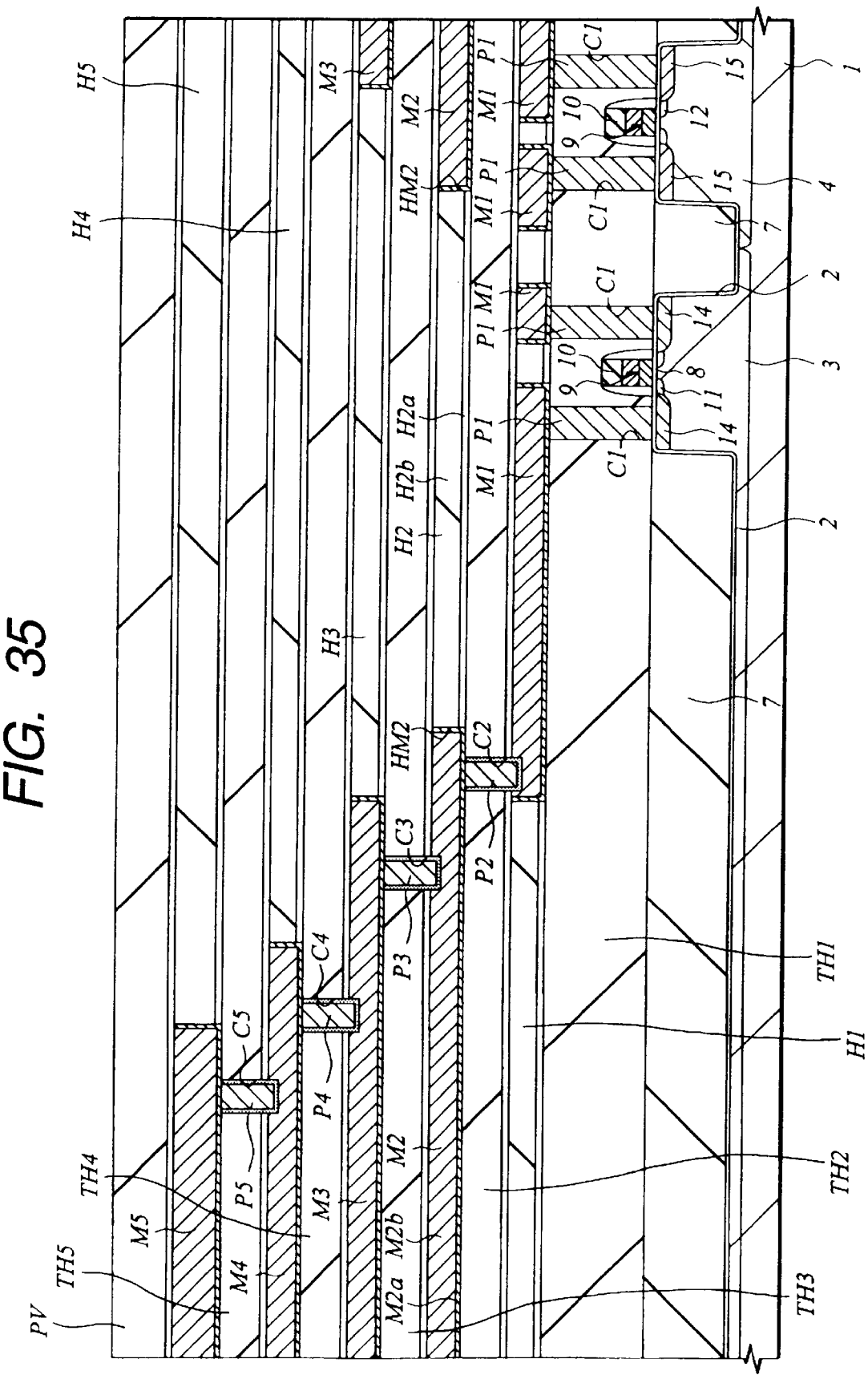
FIG. 35 is a fragmentary cross-sectional view of a substrate, which view illustrates the fabrication method of a semiconductor integrated circuit device according to Embodiment 2 of the present invention.
Figure 36:
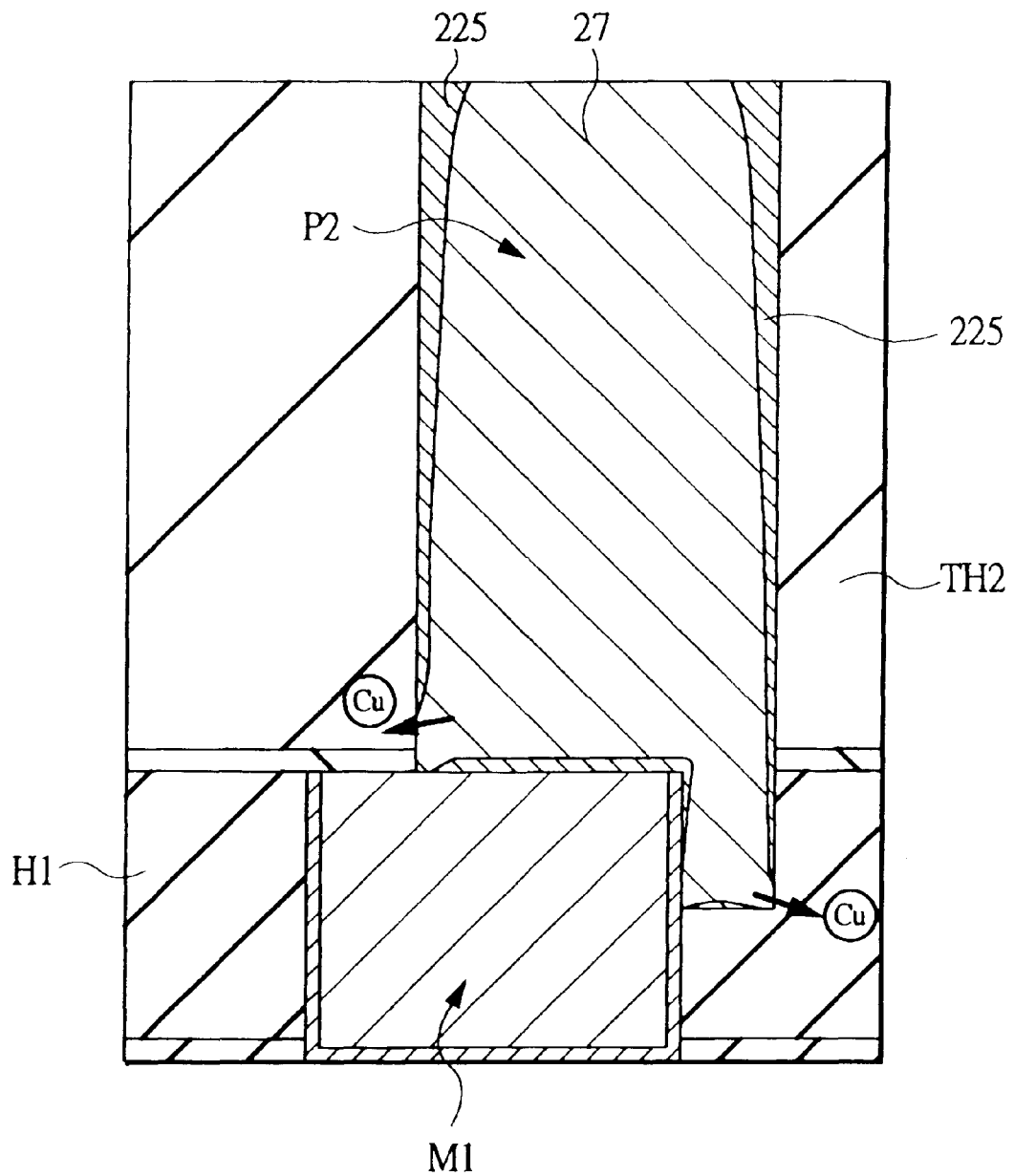
FIG. 36 illustrates the effects of this embodiment.

Over the plug P2, a second-level metallization M2 is formed in a similar manner to that employed for the formation of the first-level metallization MI. Described specifically, a silicon nitride film H2*a* and a silicon oxide film H2*b* are successively deposited over the interlayer insulating film TH2 and plug P1, followed by etching of the metallization groove insulating film H2 made thereof. A titanium nitride film M2*a* is deposited over the metallization groove insulating film H2 including the inside of the metallization groove HM2. Over this titanium nitride film M2*a*, a copper film M2*b* is formed by electroplating. From the outside of the metallization groove HM2, the copper film M2*b* and titanium nitride film M2*a* are removed by CMP to form a second-level metallization M2 made of the copper film M2 and titanium nitride film M2*a* (FIG. 35).

Interlayer insulating films (TH3~), plugs (P3~) and metallizations (M3~) are formed in repetition in a similar manner to that employed for the formation of the interlayer insulating film TH2, plug P2 and metallizations M1,M2, whereby a semiconductor integrated circuit device with a multilayer metallization is formed. FIG. 35 illustrates an example of five-level metallization (M1 to M5).

As in Embodiment 1, a passivation film PV and a bump electrode are formed on the uppermost-layer metallization. The resulting product is mounted on a package substrate or the like, whereby a semiconductor integrated circuit device is completed.

Since the first sputter film 25 and second sputter film 26 are formed inside of the contact hole C2 on the first-level metallization M1, barrier properties can be improved as in Embodiment 1.

Particularly in this embodiment, since the Cu plug (P2) is formed above the Cu metallization, if the high-melting-point metal film 225 has poor barrier properties (if the Cu alloy film 327 in the plug P2 is in contact with the silicon oxide films TH2,H1), Cu is diffused into the silicon oxide films (TH2,H1), resulting in the occurrence of short-circuit between metallizations. Invasion of Cu into the source/drain regions or channel region of MISFETQn or Qp through the silicon oxide film (TH2,H1) causes variations in threshold potential, thereby adversely affecting the properties of a device.

According to this embodiment, however, a barrier film is made of the first sputter film 25 and second sputter film 26, which brings about improvement in barrier properties. Particularly, coverage of the side walls and bottom of the contact hole C2 can be enlarged by using two films different (first and second sputter films 25,26) in directivity.

As described in Embodiment 1, a high quality film is available at a low cost, compared with a barrier film having partly or wholly made of a CVD film.

(Embodiment 3)

In Embodiment 2, the Cu plug is formed above the Cu metallization. Alternatively, the Cu plug may be formed above an Al metallization.

Figure 37:
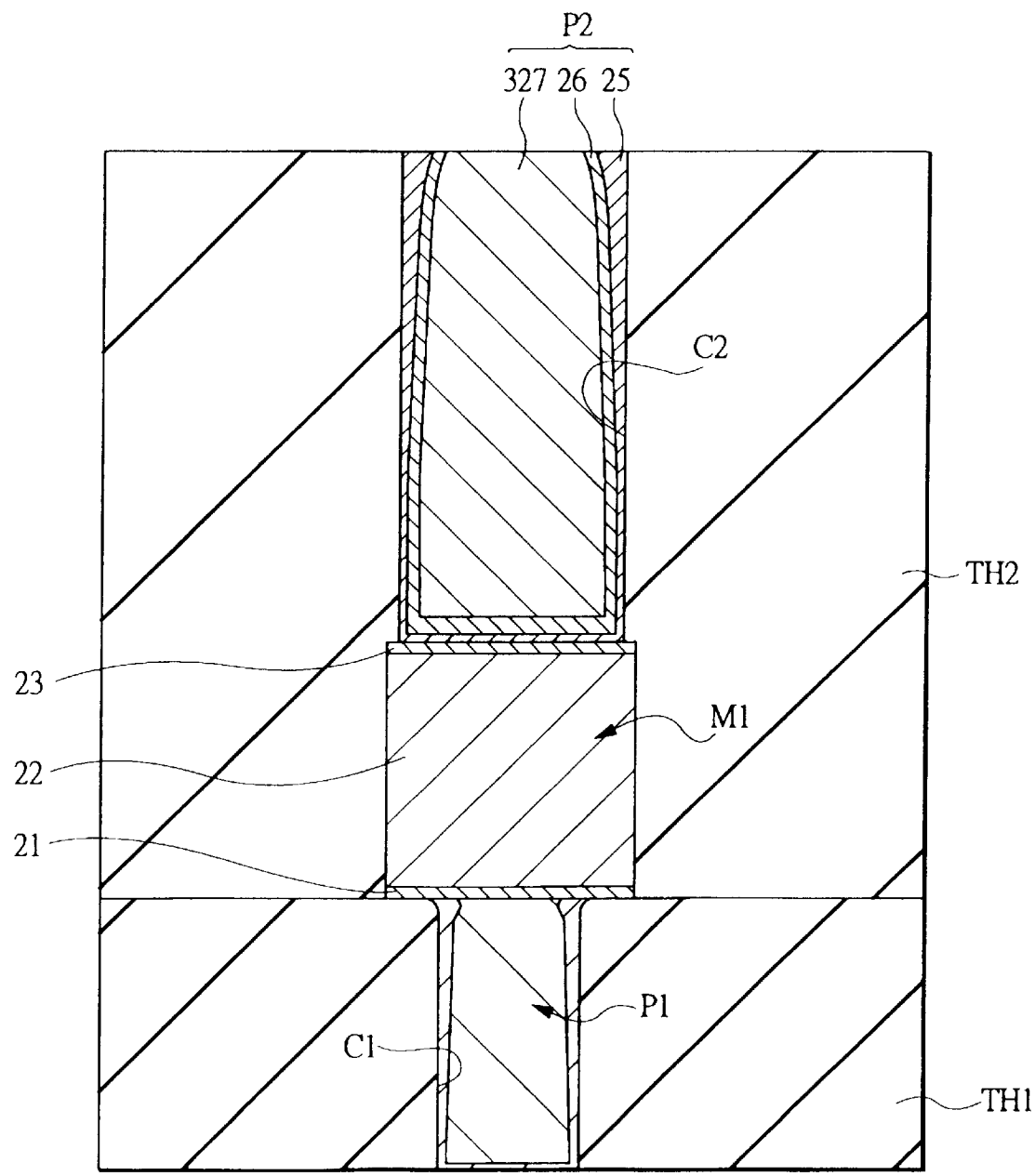
FIG. 37 is a fragmentary cross-sectional view of a substrate, which view illustrates the fabrication method of a semiconductor integrated circuit device according to Embodiment 3 of the present invention.

The fabrication method of a semiconductor integrated circuit device according to Embodiment 3 of the present invention will next be described. FIG. 37 is a fragmentary cross-sectional view of a substrate, which view illustrates the fabrication method of a semiconductor integrated circuit device according to this embodiment of the present invention. Steps up to the formation of the contact hole C2 in the interlayer insulating film TH2 above the Al metallization are similar to those of Embodiment 1 described with reference to FIGS. 1 to 20 so that detailed description on them will be omitted.

First, the semiconductor substrate 1 having the first-level metallization M1 (Al metallization) formed over the plug P1 and the contact hole C2 formed in the interlayer insulating film TH2 on the first-level metallization M1 as described in Embodiment 1 is prepared. As illustrated in FIG. 37, a first sputter film 25 which is a laminate of a Ti film and a TiN film is deposited by traditional sputtering over the interlayer insulating film TH2 including the inside of the contact hole C2.

A second sputter film 26 made of Ta is then deposited over the first sputter film 25. This second sputter film 26 is formed by long throw sputtering.

Over the second sputter film 26, a Cu alloy film 327 is then deposited by electroplating. From the outside of the contact hole C2, the Cu alloy film 327 and the first and second sputter films 25,26 are removed by CMP until the surface of the interlayer insulating film TH2 is exposed. As a result, a plug P2 formed of the Cu alloy film 327 and the first and second sputter films 25,26 is formed.

Over the interlayer insulating film TH2 and plug P2, a barrier high-melting-pint metal film, an aluminum (Al) alloy film and a cap metal film are successively deposited and patterned, whereby a second-level metallization is formed.

Since the first sputter film 25 and the second sputter film 26 are formed in the contact hole C2 above the first-level metallization M1, this embodiment, similar to Embodiment 1, makes it possible to improve the barrier properties.

Particularly in this embodiment, an Al metallization is used as the first-level metallization M1 and a Cu plug is employed as the plug P2 so that poor barrier properties cause reaction between Cu in the plug P2 and Al in the first-level metallization M1, thereby forming highly resistant duralmin. As a result, connection failure occurs between the first-level metallization M1 and plug P2.

In this embodiment, however, barrier properties can be improved by the constitution of a barrier film from the first sputter film 25 and second sputter film 26. In particular, they (the first and second sputter films 25,26) are different in directivity so that the coverage on the side walls and bottom of the contact hole C2 can be enlarged.

As described above in Embodiment 1, a higher quality barrier film is available at a lower cost compared with that formed partially or wholly from a CVD film.

(Embodiment 4)

In the above-described Embodiments 1 to 3, the present invention is applied to a plug for connecting metallizations. This invention can also be applied to a connecting plug between a substrate and a metallization.

The fabrication method of a semiconductor integrated circuit device according to Embodiment 4 of the present invention will next be described. FIGS. 38 to 43 are fragmentary cross-sectional views of a substrate, which views each illustrates the fabrication method of a semiconductor integrated circuit device according to this embodiment of the present invention. Steps up to the formation of $n^+$ type semiconductor region 14 and $p^+$ type semiconductor region 15 (source, drain) of n channel type MISFETQn and p channel type MISFETQp are similar to those of Embodiment 1 described with reference to FIG. 1 so that detailed description on them will be omitted.

After formation of the $n^+$ type semiconductor region 14 and $p^+$ type semiconductor region 15, a silicon oxide film is deposited over the semiconductor substrate 1 to give a film thickness of about 700 to 800 nm. The silicon oxide film is then polished by CMP to planarize its surface, whereby an interlayer insulating film TH1 is formed.

A photoresist film (not illustrated) is then formed over the interlayer insulating film TH1. With this photoresist film as a mask, the interlayer insulating film TH1 is etched, whereby contact holes C1 are formed over the $n^+$ type semiconductor region 14 and $p^+$ type semiconductor region 15 on the main surface of the semiconductor substrate 1. Pre-cleaning treatment is then conducted in an argon (Ar) atmosphere to remove a natural oxide film and the like from the bottom of the contact hole C1.

Figure 38:
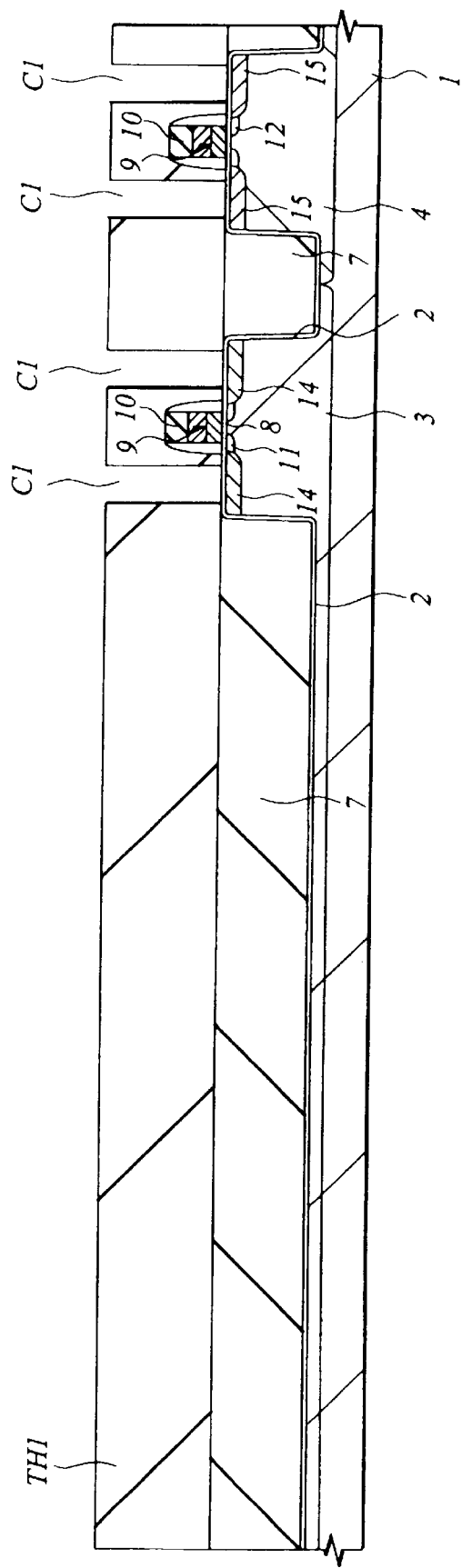
FIG. 38 is a fragmentary cross-sectional view of a substrate, which view illustrates the fabrication method of a semiconductor integrated circuit device according to Embodiment 4 of the present invention.
Figure 39:
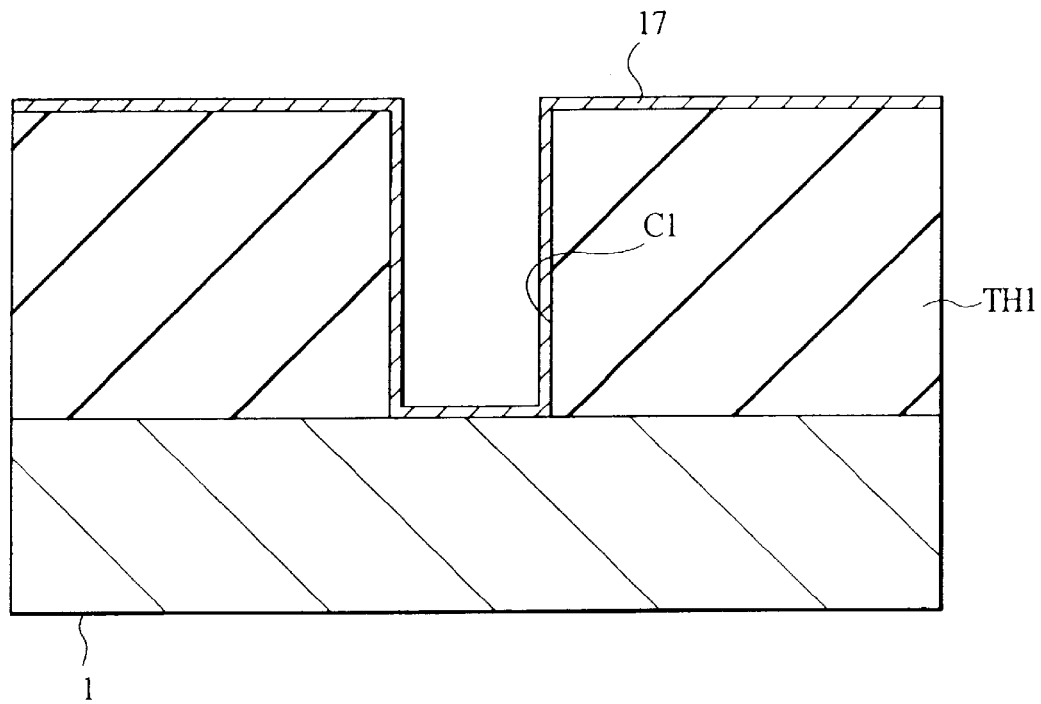
FIG. 39 is a fragmentary cross-sectional view of a substrate, which view illustrates the fabrication method of a semiconductor integrated circuit device according to Embodiment 4 of the present invention.

FIG. 39 is an enlarged view of the contact hole C1 portion of FIG. 38. In this diagram, source and drain regions ($n^+$ type semiconductor region 14, $p^+$ type semiconductor region 15) are omitted. Subsequent steps will be described using enlarged views of this contact hole C1 portion.

Figure 40:
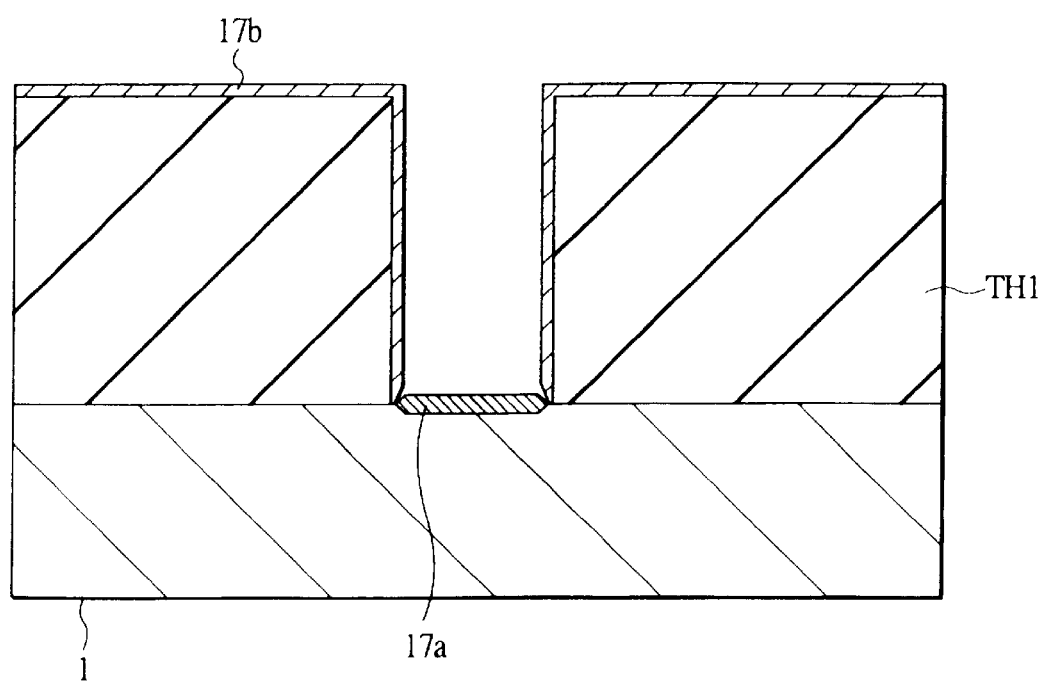
FIG. 40 is a fragmentary cross-sectional view of a substrate, which view illustrates the fabrication method of a semiconductor integrated circuit device according to Embodiment 4 of the present invention.

As illustrated in FIG. 39, a Ti film 17 is deposited over the interlayer insulating film TH1 including the inside of the contact hole C1 by sputtering or CVD. By heat treatment under a nitrogen gas atmosphere, a silicide forming reaction is caused at the contact part between the semiconductor substrate 1 at the bottom of the contact hole C1 and the Ti film 17 and at the same time, the Ti film 17 on the side walls of the contact hole C1 and over the interlayer insulating film TH1 are nitrided. As a result, a $TiSi_2$ film 17a is formed on the bottom of the contact hole C1, while a TiN film 17b is formed over the side walls of the contact hole C1 and interlayer insulating film TH1 (FIG. 40).

Figure 41:
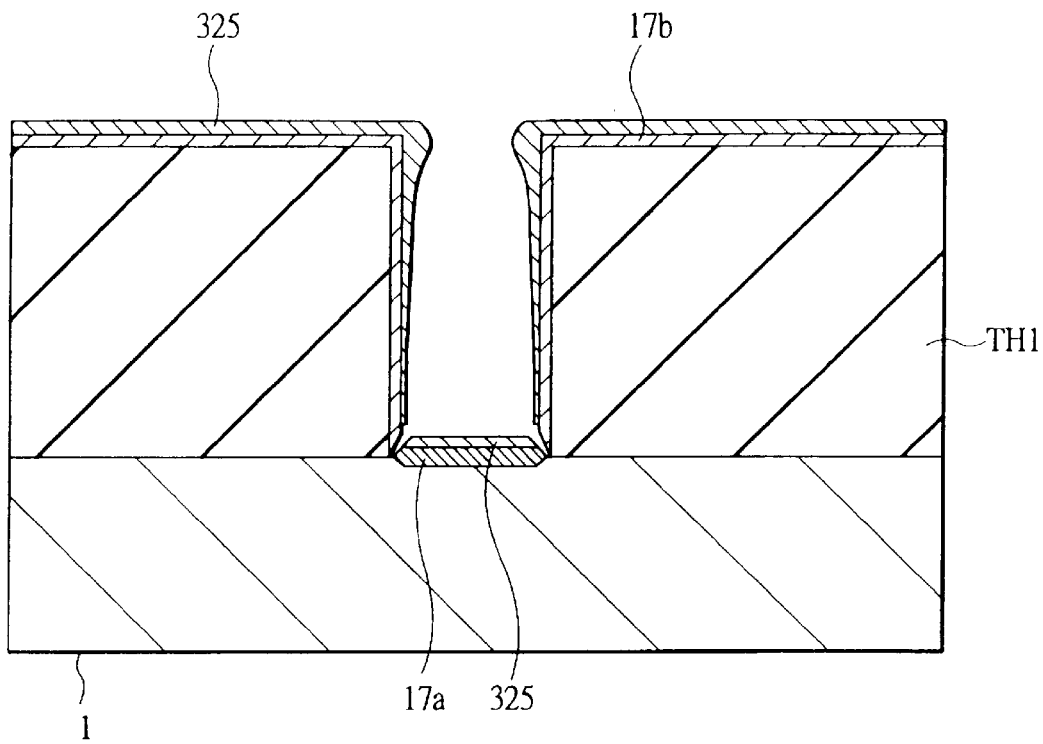
FIG. 41 is a fragmentary cross-sectional view of a substrate, which view illustrates the fabrication method of a semiconductor integrated circuit device according to Embodiment 4 of the present invention.
Figure 42:
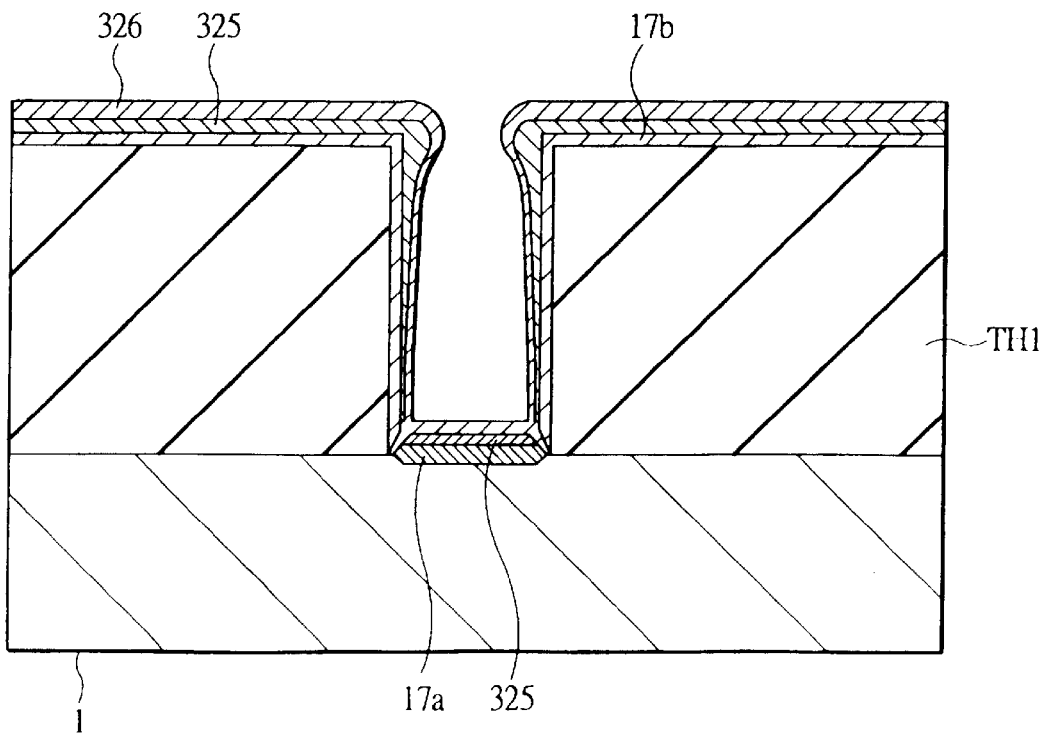
FIG. 42 is a fragmentary cross-sectional view of a substrate, which view illustrates the fabrication method of a semiconductor integrated circuit device according to Embodiment 4 of the present invention.

As illustrated in FIG. 41, a first sputter film 325 formed of a TiN film is deposited by traditional sputtering, followed by deposition thereover of a second sputter film 326 made of a W film by long throw sputtering as illustrated in FIG. 42.

Figure 43:
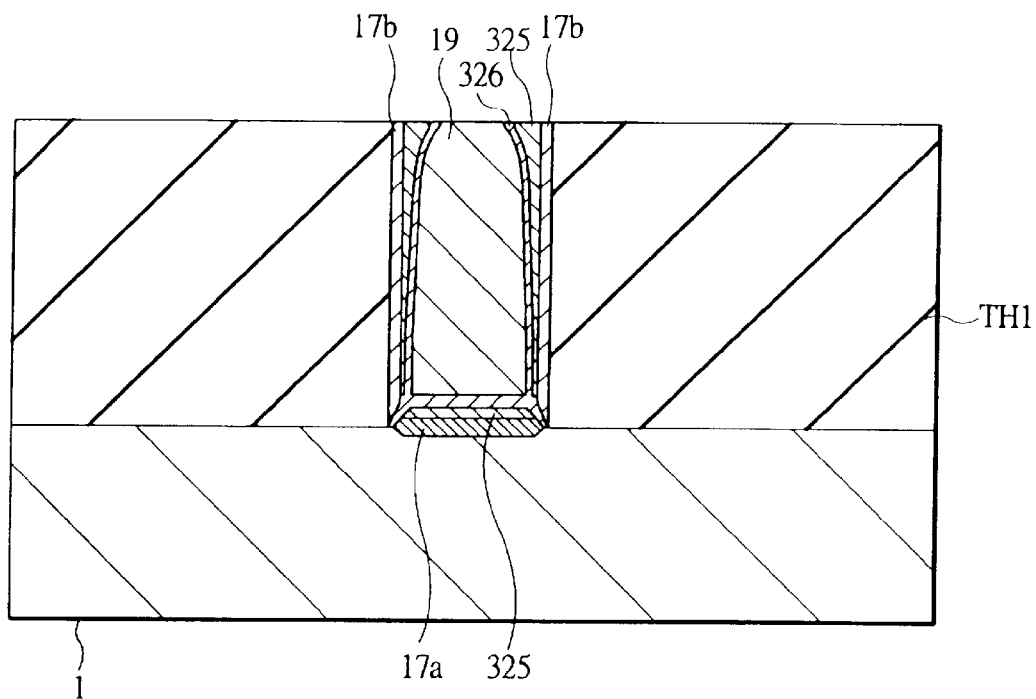
FIG. 43 is a fragmentary cross-sectional view of a substrate, which view illustrates the fabrication method of a semiconductor integrated circuit device according to Embodiment 4 of the present invention.
Figure 44:
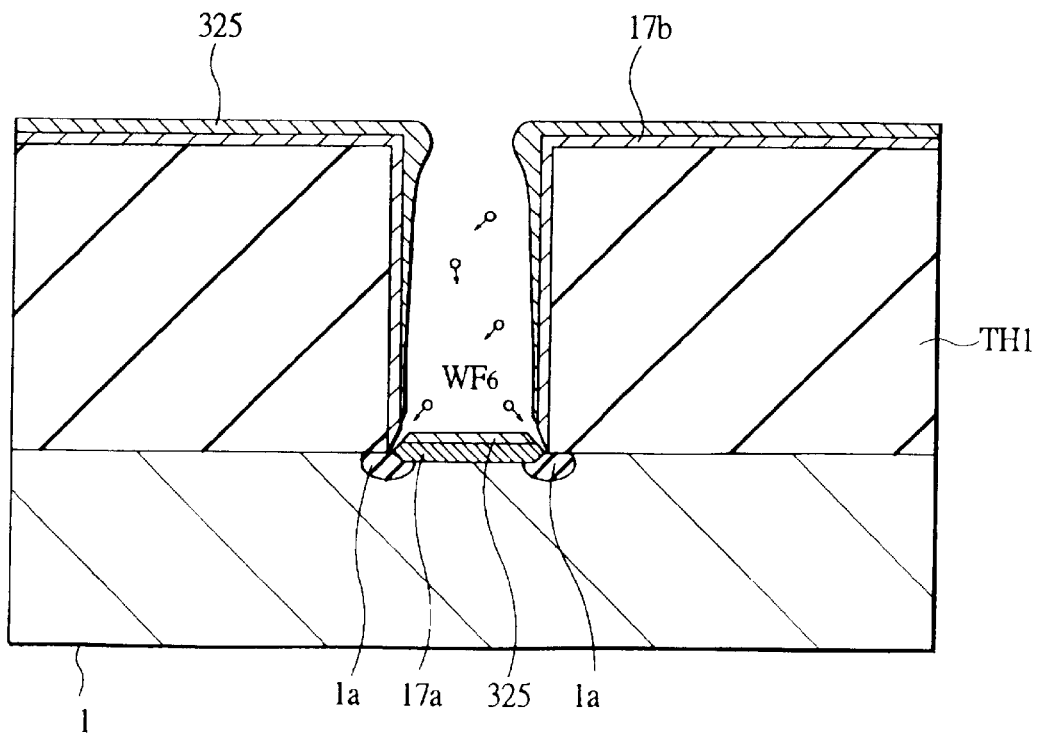
FIG. 44 illustrates the effects of this embodiment.

As illustrated in FIG. 43, a W film 19 is deposited over the second sputter film 326 by CVD. This W film 19 is deposited to give a thickness enough for filling therewith the contact hole C1. From the outside of the contact hole C1, the W film 19 and the first and second sputter films 325,226 are removed by CMP until the exposure of the surface of the interlayer insulating film TH1. As a result, a plug P1 made of the W film 19 and the first and second sputter films 325,326 is formed.

Over the interlayer insulating film TH1 and plug P1, an Al metallization or Cu metallization is formed as in Embodiments 1 to 3.

In this embodiment, the first sputter film 325 and the second sputter film 326 are formed inside of the contact hole C1 over the first-level metallization M1 so that barrier properties can be improved as in Embodiment 1.

Described specifically, when the W film 19 is deposited over the bottom of the contact hole while the barrier properties of the high-melting-point metal film 225 are low, the exposed portion (Si) of the semiconductor substrate 1 is eroded by $WF_6$, which is a raw material for the W film 19, causing high-resistance failure or generation of junction leaks. This high-resistance failure occurs owing to the formation of a high resistance layer (1a) by the reaction between F and Si. Junction leaks are, on the other hand, caused by the growth of a W film even to the vicinity of the gate electrode through the exposed portion of the semiconductor substrate 1, thereby allowing an electric current to pass between the source and drain regions.

According to this embodiment, however, barrier properties of the barrier film can be improved by constituting it from the first sputter film 325 and second sputter film 326. Since these films (first and second sputter films 325,326) are different in directivity, the coverage of the side walls and bottom of the contact hole C1 can be enlarged.

As described above in Embodiment 1, a higher quality barrier film is available at a lower cost compared with a barrier film formed partially or wholly of a CVD film.

(Embodiment 5)

In Embodiments 1 to 4, after formation of a traditional sputter film (25) in a plug, a long throw sputter film (26) is formed. Alternatively, the traditional sputter film may be formed in the plug after formation of the long throw sputter film.

Figure 45:
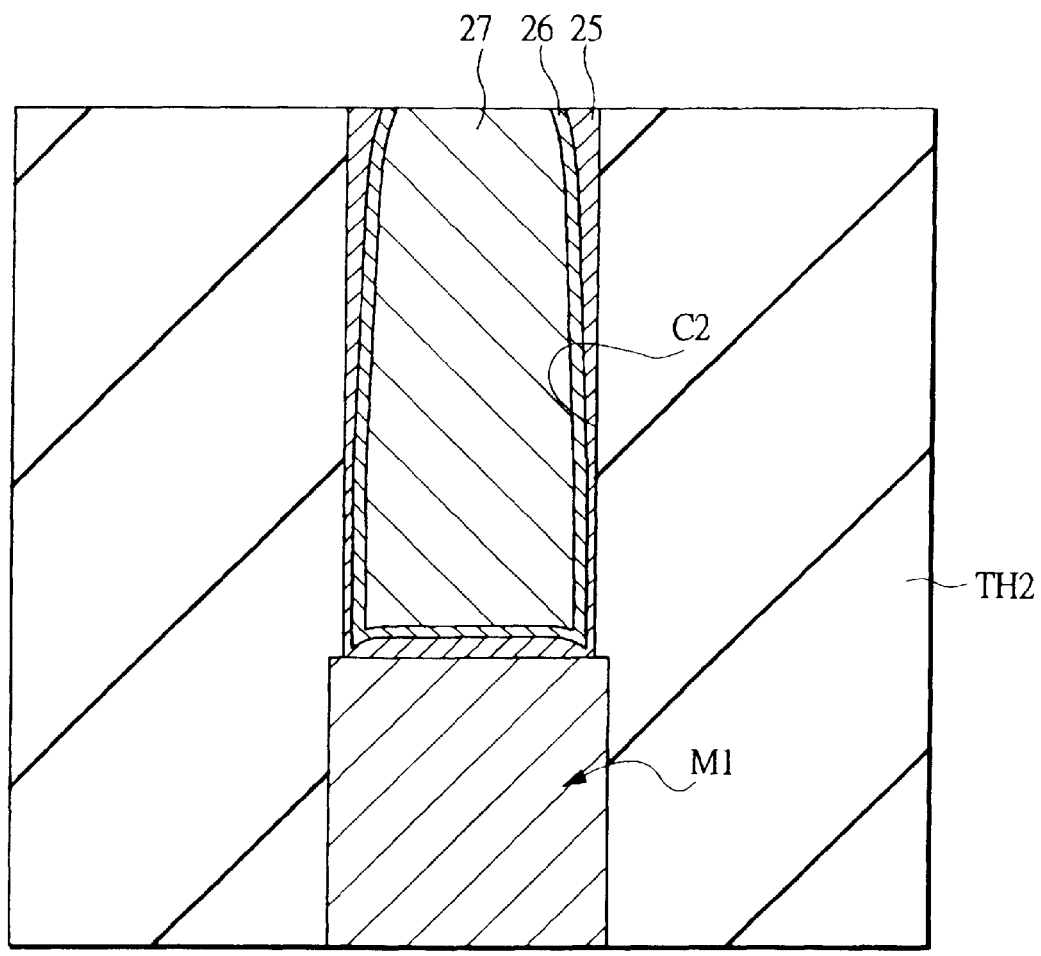
FIG. 45 is a fragmentary cross-sectional view of a substrate, which view illustrates a semiconductor integrated circuit device according to Embodiment 5 of the present invention.

FIG. 45 is a fragmentary cross-sectional view of a substrate which view illustrates the semiconductor integrated circuit device according to Embodiment 5 of the present invention. As illustrated in FIG. 45, a long throw sputter film 26 is formed on the inside walls of the contact hole C2, followed by the formation thereover of the traditional sputter film 25.

In this embodiment, the long throw sputter film is formed first so that thickness of a hood-like protruded film on the upper portion of the side walls of the contact hole can be reduced and filling properties of the sputter film 26 or metal film 27 such as W can be improved.

As described above, however, a film formed by long throw sputtering has a large compressive stress, so that this embodiment is suited for the case where the contact hole has a large diameter or where an alignment margin between the metallization pattern and contact hole pattern is large.

Since the fabrication method of the semiconductor integrated circuit device according to this embodiment is similar to that of Embodiments 1 to 4 except that the first sputter film (25,325) is formed by long throw sputtering and the second sputter film (26,326) is formed by traditional sputtering, detailed description is omitted. The sputter film 26 may alternatively be formed by sputtering using a collimator or ionized sputtering.

The inventions made by the present inventors have so far been described specifically based on embodiments. It is needless to say that the present invention is not limited to or by them but can be changed within an extent not departing from the scope of the invention.

In the above-described embodiments, MISFETQn and Qp are formed as a semiconductor device. It is also possible to form SRAM memory cell or flash memory cell by using these MISFETs. Thus, the technique of the present invention can be applied widely to a semiconductor device having a portion for connecting a substrate with a metallization or metallizations.

Advantages available by the typical inventions, among the inventions disclosed by this application, will next be described briefly.

Any one of the embodiments of the present invention can provide a good contact between metallizations or between a semiconductor substrate and a metallization.

The present invention makes it possible to heighten the reliability of the semiconductor integrated circuit device and improve the yield of the product.

What is claimed is:

1. A fabrication method for a semiconductor integrated circuit device, comprising the steps of:

(a) forming a first insulating film over a semiconductor substrate;

(b) forming a barrier metal film over said first insulating film;

(c) forming an aluminum alloy wiring film over said barrier metal film and to a thickness larger than that of said barrier metal film;

(d) forming a capping metal film over the aluminum alloy wiring film and to a thickness smaller than that of said aluminum alloy wiring film;

(e) dry etching said barrier metal film, said aluminum alloy wiring film, and said capping metal film, thereby forming a first wiring pattern;

(f) forming a second insulating film over said first insulating film and over said first wiring pattern;

(g) selectively dry etching said second insulating film, thereby forming a connecting hole through the second insulating film;

(h) depositing a first electroconductive film over said second insulating film including the inside of said connecting hole by a non-directional sputtering method so as to electrically connect to said first wiring pattern;

(i) depositing a second electroconductive film over said first electroconductive film by a directional sputtering method having higher directivity than said non-directional sputtering method; and (j) forming a third electroconductive film of tungsten over said second electroconductive film so as to fill said connecting hole, said third electroconductive film being formed to a thickness larger than that of said first and second electroconductive films, and, thereafter, removing the first, second and third electroconductive films from the outside of said connecting hole, thereby forming a plug.

2. A fabrication method for a semiconductor integrated circuit device according to claim 1, wherein said directional sputtering method is long throw sputtering.

3. A fabrication method for a semiconductor integrated circuit device according to claim 2, wherein said long throw sputtering is conducted while applying a potential to said semiconductor substrate.

4. A fabrication method for a semiconductor integrated circuit device according to claim 1, wherein said directional sputtering method is sputtering using a collimator.

5. A fabrication method for a semiconductor integrated circuit device according to claim 1, wherein said directional sputtering method is ionized sputtering.

6. A fabrication method for a semiconductor integrated circuit device, comprising the steps of:

(a) forming a first insulating film over a semiconductor substrate;

(b) forming a barrier metal film over the first insulating film;

(c) forming an aluminum alloy wiring film over the barrier metal film and to a thickness larger than that of said barrier metal film;

(d) forming a capping metal film over the aluminum alloy wiring film and to a thickness smaller than that of said aluminum alloy wiring film;

(e) dry etching said barrier metal film, said aluminum alloy wiring film, and said capping metal film, thereby forming a first wiring pattern;

(f) forming a second insulating film over said first insulating film and over said first wiring pattern;

(g) selectively dry etching said second insulating film, thereby forming a connecting hole through said second insulating film;

(h) depositing a first electroconductive film over said second insulating film including the inside of said connecting hole by a first sputtering method;

(i) depositing a second electroconductive film over said first electroconductive film by a second sputtering method having higher directivity than said first sputtering method; and (j) forming a third electroconductive film of tungsten over said second electroconductive film so as to fill said connecting hole and removing the first, second and third electroconductive films from the outside of said connecting hole, thereby forming a plug.

7. A fabrication method for a semiconductor integrated circuit device according to claim 6, wherein said first wiring pattern is an aluminum metallization and said third electroconductive film is a tungsten film.

8. A fabrication method for a semiconductor integrated circuit device according to claim 7, wherein said second sputtering method is long throw sputtering.

9. A fabrication method for a semiconductor integrated circuit device according to claim 8, wherein said long throw sputtering is conducted while applying a potential to said semiconductor substrate.

10. A fabrication method for a semiconductor integrated circuit device according to claim 7, wherein said second sputtering method is sputtering using a collimator.

11. A fabrication method for a semiconductor integrated circuit device according to claim 7, wherein said second sputtering method is ionized sputtering.

12. A fabrication method for a semiconductor integrated circuit device according to claim 6, wherein said first and second electroconductive films are each a high-melting-point metal film or a film made of a high-melting-point metal compound.

13. A fabrication method for a semiconductor integrated circuit device according to claim 6, wherein said first electroconductive film is a high-melting-point metal film.

14. A fabrication method for a semiconductor integrated circuit device according to claim 6, wherein said first and second electroconductive films are each made of Ti, TiN, W, Ta, TaN, TaSiN, TiSiN, TiW or WN.

15. A fabrication method for a semiconductor integrated circuit device according to claim 6, wherein said first wiring pattern is an aluminum metallization and said third electroconductive film is a copper film.

16. A fabrication method for a semiconductor integrated circuit device according to claim 15, wherein said second sputtering method is long throw sputtering.

17. A fabrication method for a semiconductor integrated circuit device according to claim 18, wherein said long throw sputtering is conducted while applying a potential to said semiconductor substrate.

18. A fabrication method for a semiconductor integrated circuit device according to claim 15, wherein said second sputtering method is sputtering using a collimator.

19. A fabrication method for a semiconductor integrated circuit device according to claim 15, wherein said second sputtering method is ionized sputtering.

20. A fabrication method for a semiconductor integrated circuit device, comprising the steps of:

(a) forming a first insulating film over a semiconductor substrate;

(b) forming a barrier metal film over said first insulating film;

(c) forming an aluminum alloy wiring film over said barrier metal film and to a thickness larger than that of said barrier metal film;

(d) forming a capping metal film over said aluminum alloy wiring film and to a thickness smaller than that of said aluminum alloy wiring film;

(e) dry etching said barrier metal film, said aluminum alloy wiring film, and said capping metal film, thereby forming a first wiring pattern;

(f) forming a second insulating film over said first insulating film and over said first wiring pattern;

(g) selectively dry etching said second insulating film, thereby forming a connecting hole through said second insulating film;

(h) depositing a first electroconductive film over said second insulating film including the inside of said connecting hole by a first sputtering method using a long throw sputtering apparatus;

(i) depositing a second electroconductive film over said first electroconductive film by a second sputtering method using a non-long throw sputtering apparatus having lower directivity than said long throw sputtering apparatus; and (j) forming a third electroconductive film of tungsten over said second electroconductive film so as to fill said connecting hole and removing the first, second and third electroconductive films from the outside of said connecting hole, thereby forming a plug.

21. A fabrication method for a semiconductor integrated circuit device, comprising the steps of:

(a) forming a first insulating film over a semiconductor substrate;

(b) forming a barrier metal film over said first insulating film;

(c) forming an aluminum alloy wiring film over said barrier metal film and to a thickness larger than that of said barrier metal film;

(d) forming a capping metal film over the aluminum alloy wiring film and to a thickness smaller than that of said aluminum alloy wiring film;

(e) dry etching said barrier metal film, said aluminum alloy wiring film, and said capping metal film, thereby forming a first wiring pattern:

(f) forming a second insulating film over said first insulating film and over said first wiring pattern;

(g) selectively dry etching said second insulating film, thereby forming a connecting hole through said second insulating film;

(h) depositing a first electroconductive film over said second insulating film including the inside of said connecting hole by a first sputtering method using an ionized sputtering apparatus;

(i) depositing a second electroconductive film over said first electroconductive film by a second sputtering method using a non-long throw sputtering apparatus having lower directivity than said ionized sputtering apparatus; and (j) forming a third electroconductive film of tungsten over said second electroconductive film so as to fill said connecting hole and removing the first, second and third electroconductive films from the outside of said connecting hole, thereby forming a plug.

* * * * *